United States Patent
Yamazaki et al.

(10) Patent No.: US 9,236,490 B2
(45) Date of Patent: Jan. 12, 2016

(54) TRANSISTOR INCLUDING OXIDE SEMICONDUCTOR FILM HAVING REGIONS OF DIFFERENT THICKNESS

(71) Applicant: Semiconductor Energy Laboratory Co., Ltd., Atsugi-shi, Kanagawa-ken (JP)

(72) Inventors: Shunpei Yamazaki, Setagaya (JP); Daisuke Matsubayashi, Atsugi (JP); Keisuke Murayama, Chigasaki (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 49 days.

(21) Appl. No.: 13/865,435

(22) Filed: Apr. 18, 2013

(65) Prior Publication Data

US 2013/0285047 A1   Oct. 31, 2013

(30) Foreign Application Priority Data

Apr. 27, 2012 (JP) ................................ 2012-103551
Mar. 14, 2013 (JP) ................................ 2013-052035

(51) Int. Cl.
*H01L 29/10* (2006.01)
*H01L 29/786* (2006.01)

(52) U.S. Cl.
CPC ...... *H01L 29/7869* (2013.01); *H01L 29/78696* (2013.01)

(58) Field of Classification Search
USPC ............... 257/43, E21.46, E33.013, E29.296; 438/104
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Matthew Gordon
(74) *Attorney, Agent, or Firm* — Robinson Intellectual Property Law Office; Eric J. Robinson

(57) ABSTRACT

A transistor including an oxide semiconductor film, in which the threshold voltage is prevented from being a negative value, is provided. A high quality semiconductor device having the transistor including an oxide semiconductor film is provided. A transistor includes an oxide semiconductor film having first to third regions. The top surface of the oxide semiconductor film in the first region is in contact with a source electrode or a drain electrode. The top surface of the oxide semiconductor film in the second region is in contact with a protective insulating film. The thickness of the second region is substantially uniform and smaller than the maximum thickness of the first region. The top surface and a side surface of the oxide semiconductor film in the third region are in contact with the protective insulating film.

20 Claims, 12 Drawing Sheets

(56) References Cited

U.S. PATENT DOCUMENTS

| | | | |
|---|---|---|---|
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,071,037 B2 | 7/2006 | Suzawa et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,420,209 B2 | 9/2008 | Suzawa et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,714,329 B2 | 5/2010 | Suzawa et al. |
| 7,732,819 B2 | 6/2010 | Akimoto et al. |
| 7,791,072 B2 | 9/2010 | Kumomi et al. |
| 7,808,000 B2 | 10/2010 | Yamazaki et al. |
| 7,875,886 B2 | 1/2011 | Suzawa et al. |
| 8,053,781 B2 | 11/2011 | Suzawa et al. |
| 8,101,444 B2 | 1/2012 | Yamazaki et al. |
| 8,183,102 B2 | 5/2012 | Yamazaki et al. |
| 8,237,166 B2 | 8/2012 | Kumomi et al. |
| 8,330,887 B2 | 12/2012 | Kurokawa et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0090916 A1* | 4/2009 | Yamazaki et al. .............. 257/66 |
| 2009/0114910 A1 | 5/2009 | Chang |
| 2009/0134399 A1 | 5/2009 | Sakakura et al. |
| 2009/0140251 A1 | 6/2009 | Yamazaki |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0025679 A1 | 2/2010 | Yamazaki et al. |
| 2010/0065844 A1 | 3/2010 | Tokunaga |
| 2010/0072468 A1* | 3/2010 | Yamazaki et al. .............. 257/43 |
| 2010/0092800 A1 | 4/2010 | Itagaki et al. |
| 2010/0102315 A1* | 4/2010 | Suzawa et al. .................. 257/43 |
| 2010/0109002 A1 | 5/2010 | Itagaki et al. |
| 2011/0068852 A1* | 3/2011 | Yamazaki et al. ............. 327/434 |
| 2012/0043544 A1 | 2/2012 | Suzawa et al. |
| 2012/0097941 A1 | 4/2012 | Yamazaki |
| 2012/0112184 A1 | 5/2012 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2006-165529 | 6/2006 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

(56) References Cited

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.
Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J at al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by PEALD Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

(56) References Cited

OTHER PUBLICATIONS

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, andYb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

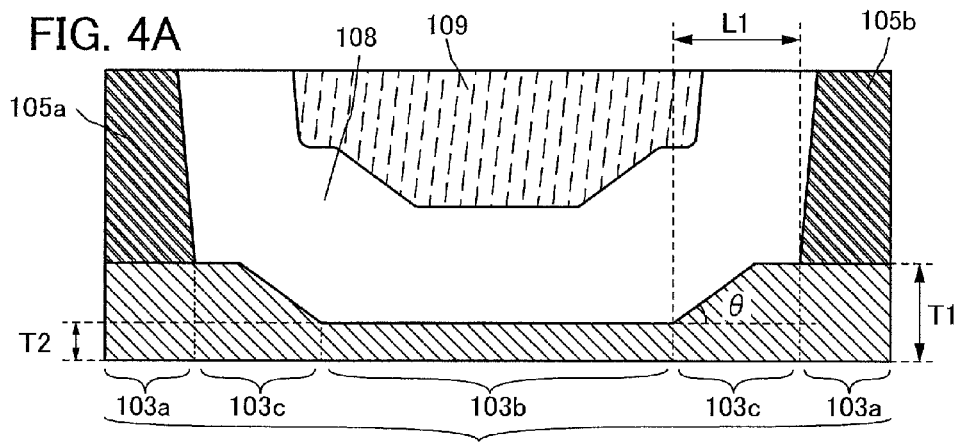
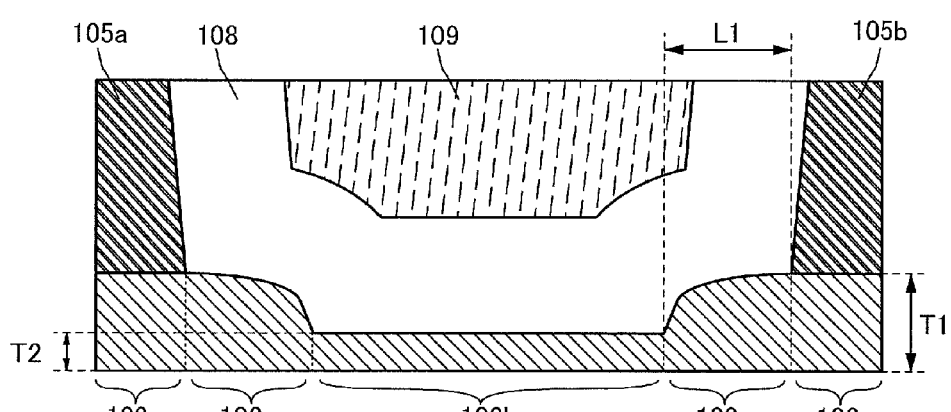
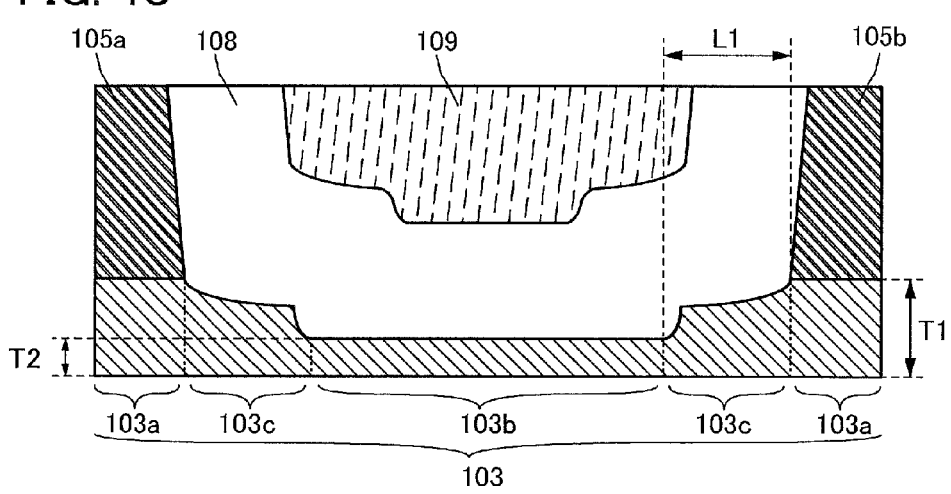

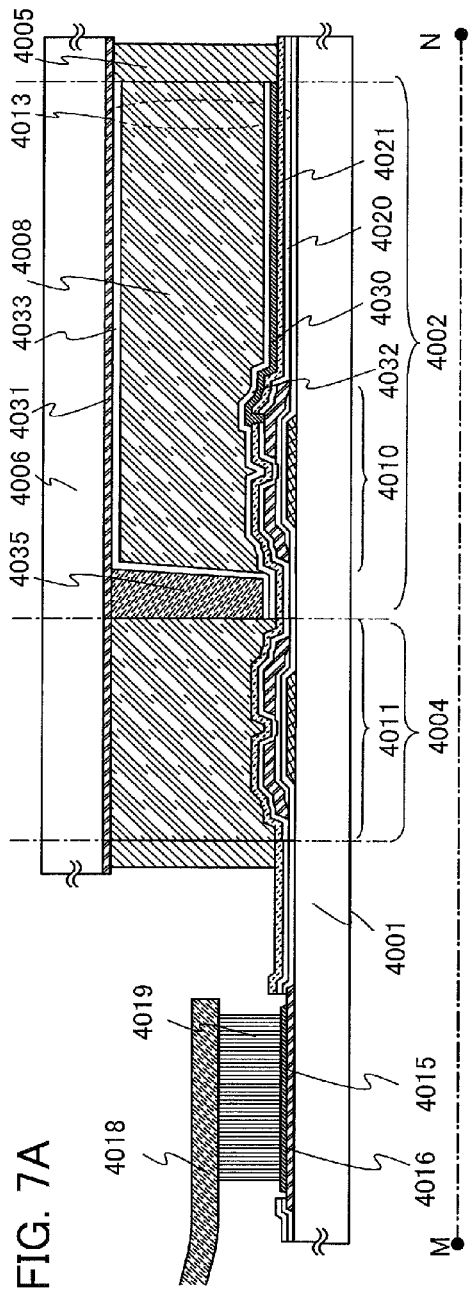
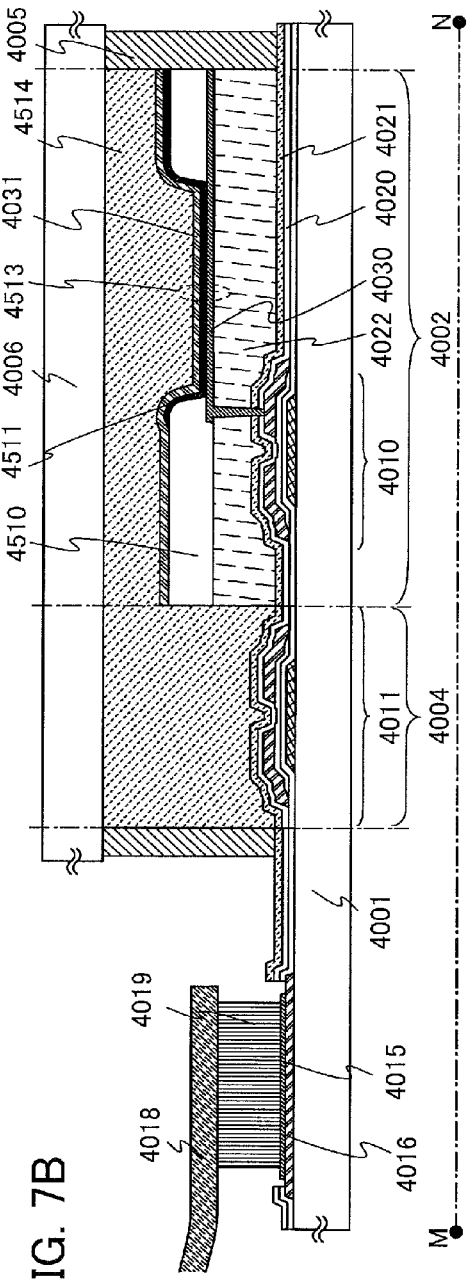
FIG. 7A
FIG. 7B

TRANSISTOR INCLUDING OXIDE SEMICONDUCTOR FILM HAVING REGIONS OF DIFFERENT THICKNESS

BACKGROUND OF THE INVENTION

1. Field of the Invention

The present invention relates to a semiconductor device including an oxide semiconductor.

In this specification, a semiconductor device means all types of devices which can function by utilizing semiconductor characteristics, and an electro-optical device, a semiconductor circuit, and an electronic device are all semiconductor devices.

2. Description of the Related Art

A technique by which transistors are formed using semiconductor thin films formed over a substrate having an insulating surface has been attracting attention. The transistor has been applied to a wide range of electronic devices such as an integrated circuit (IC) and an image display device (also simply referred to as a display device). A silicon-based semiconductor material is widely known as a material for a semiconductor thin film applicable to a transistor. As another material, an oxide semiconductor has been attracting attention.

For example, Patent Document 1 discloses a transistor including a semiconductor thin film formed using an amorphous oxide containing indium (In), gallium (Ga), and zinc (Zn) (In—Ga—Zn—O-based amorphous oxide). In addition, Patent Document 2 discloses a technique by which a transistor similar to that in Patent Document 1 is manufactured and used as a switching element or the like in a pixel of a display device.

REFERENCE

Patent Document

[Patent Document 1] Japanese Published Patent Application No. 2006-165529
[Reference 2] Japanese Published Patent Application No. 2006-165528

SUMMARY OF THE INVENTION

In a transistor used in a circuit of a semiconductor device such as a display device, a channel is preferably formed at a positive gate voltage which is as close to 0 V as possible because of the following reason: when the transistor has a negative threshold voltage, the transistor tends to be normally-on, in which current flows between a source electrode and a drain electrode even when the gate voltage is 0 V; and a circuit including such a normally-on transistor with a negative threshold voltage is very difficult to control.

In view of the above, an object of one embodiment of the disclosed invention is to provide a transistor including an oxide semiconductor film, in which the threshold voltage is prevented from being a negative value. Another object is to provide a normally-off transistor including an oxide semiconductor film, in which the threshold voltage is prevented from being a negative value. Another object is to provide a high quality semiconductor device including the transistor having an oxide semiconductor film.

As one of factors of the negative threshold voltage due to a negative shift in a bottom-gate transistor including an oxide semiconductor film, the electric field concentration in the vicinity of the interface between the oxide semiconductor film and a protective insulating film can be given. This is probably because positively charged mobile ions and the like are drawn to the vicinity of the interface between the protective insulating film and the oxide semiconductor film by the extreme concentration of the electric field at an end face portion of a source electrode or a drain electrode which is in contact with the top surface of the oxide semiconductor film, and negative charges in the oxide semiconductor film are drawn by the positive charges, leading to formation of an artificial channel (hereinafter also referred to as a parasitic channel).

The disclosed invention includes an oxide semiconductor film having a first region, a second region, and a third region. The top surface of the oxide semiconductor film in the first region is in contact with a source electrode or a drain electrode. The top surface of the oxide semiconductor film in the second region is in contact with a protective insulating film. The thickness of the second region is substantially uniform and smaller than the maximum thickness of the first region. The top surface and a side surface of the oxide semiconductor film in the third region are in contact with the protective insulating film. In other words, the oxide semiconductor film has a pair of first regions with a large thickness, which overlaps with the source electrode and the drain electrode, a pair of third regions provided between the pair of first regions, and the second region which is thinner than the pair of first regions and is provided between the pair of third regions.

Note that in this specification and the like, the oxide semiconductor film has a depression portion in the second region and part of the third region, and an inner wall of the depression portion is described as the side surface of the oxide semiconductor film in the third region.

With such a structure, an electric field can be reduced at least in the vicinity of the second region. Accordingly, the electric field concentration in the vicinity of the interface between the oxide semiconductor film and the protective insulating film can be reduced, and the threshold voltage of the transistor can be prevented from being a negative value. Specifically, the following embodiment can be employed, for example.

One embodiment of the disclosed invention is a semiconductor device including a gate electrode over a substrate having an insulating surface, a gate insulating film over the gate electrode, an oxide semiconductor film which overlaps with at least part of the gate electrode and which is over the gate insulating film, a source electrode and a drain electrode over the oxide semiconductor film, and a protective insulating film over the oxide semiconductor film, the source electrode, and the drain electrode. The oxide semiconductor film includes a first region, and a second region and a third region which are collectively a channel formation region. A top surface of the oxide semiconductor film in the first region is in contact with the source electrode or the drain electrode. A top surface of the oxide semiconductor film in the second region is in contact with the protective insulating film. A thickness of the second region is substantially uniform and smaller than a maximum thickness of the first region. A top surface and a side surface of the oxide semiconductor film in the third region are in contact with the protective insulating film.

In the above semiconductor device, a distance between the first region and the second region is preferably longer than a distance between the source electrode and the drain electrode by a factor greater than or equal to 0.059 and less than 0.5.

The oxide semiconductor film may have a tapered portion in the third region.

Further, the protective insulating film is preferably an insulating film containing at least oxygen.

In this specification and the like, the expression "substantially uniform" does not necessarily mean being exactly uniform. For example, the expression "thickness which is substantially uniform" includes the degree of uniformity in a thickness, which is obtained by etching one layer.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Thus, the terms "source" and "drain" can be used to denote the drain and the source, respectively, in this specification.

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

A transistor including an oxide semiconductor film, in which the threshold voltage is prevented from being a negative value, can be provided. A normally-off transistor including an oxide semiconductor film, in which the threshold voltage is prevented from being a negative value, can also be provided. Further, a high quality semiconductor device including the transistor having an oxide semiconductor film can be provided.

BRIEF DESCRIPTION OF THE DRAWINGS

FIGS. 4A to 4C are cross-sectional views each illustrating one embodiment of a semiconductor device.

FIGS. 7A and 7B are cross-sectional views each illustrating one embodiment of a semiconductor device.

DETAILED DESCRIPTION OF THE INVENTION

Hereinafter, embodiments of the invention disclosed in this specification will be described with reference to the accompanying drawings. Note that the invention disclosed in this specification is not limited to the following description, and it is easily understood by those skilled in the art that modes and details can be variously changed without departing from the spirit and the scope of the invention. Thus, the invention disclosed in this specification is not construed as being limited to the description of the following embodiments. Note that the ordinal numbers such as "first" and "second" are used for convenience and do not denote the order of steps and the stacking order of layers. In addition, the ordinal numbers in this specification do not denote any particular names to define the invention.

(Embodiment 1)

In this embodiment, one embodiment of a semiconductor device including an oxide semiconductor film and a method for manufacturing the semiconductor device will be described with reference to FIGS. 1A and 1B, FIGS. 2A to 2C, FIGS. 3A and 3B, and FIGS. 4A to 4C.

Figure 1A:
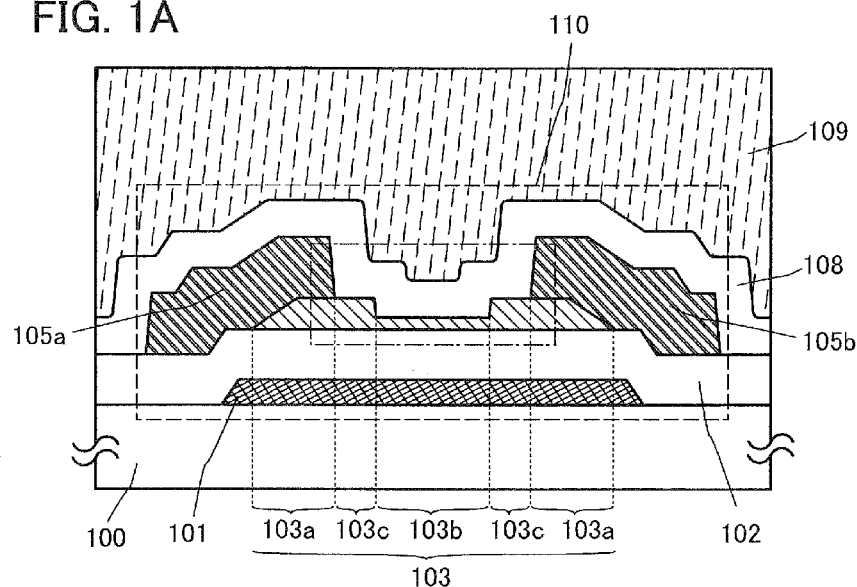
FIGS. 1A and 1B are cross-sectional views illustrating one embodiment of a semiconductor device.
Figure 1B:
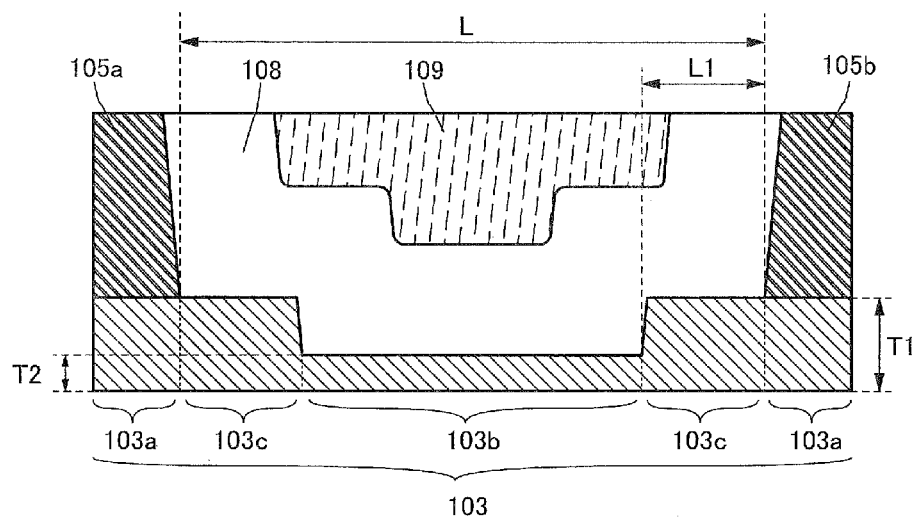

A transistor 110 illustrated in FIGS. 1A and 1B is an example of a transistor which is a kind of bottom-gate transistor and is also referred to as an inverted-staggered transistor. Note that FIG. 1A is a cross-sectional view of the transistor 110, and FIG. 1B is an enlarged view of the vicinity of an oxide semiconductor film 103 in the transistor 110 illustrated in FIG. 1A.

The transistor 110 illustrated in FIGS. 1A and 1B includes a gate electrode 101 over a substrate 100 having an insulating surface, a gate insulating film 102 over the gate electrode 101, the oxide semiconductor film 103 which overlaps with at least part of the gate electrode 101 and which is over the gate insulating film 102, a source electrode 105a and a drain electrode 105b over the oxide semiconductor film 103, and a protective insulating film 108 over the oxide semiconductor film 103, the source electrode 105a, and the drain electrode 105b. Further, a planarization insulating film 109 over the protective insulating film 108 may be included as a component of the transistor 110. Note that the oxide semiconductor film 103 may have either a single-layer structure or a stacked-layer structure. Further, in a channel length direction, edge portions of the gate electrode 101 may be located outside edge portions of the oxide semiconductor film 103.

As illustrated in FIGS. 1A and 1B, the oxide semiconductor film 103 includes a first region 103a, a second region 103b, and a third region 103c. The top surface of the oxide semiconductor film 103 in the first region 103a is in contact with the source electrode 105a or the drain electrode 105b. The top surface of the oxide semiconductor film 103 in the second region 103b is in contact with the protective insulating film 108. The thickness of the second region 103b is substantially uniform and smaller than the maximum thickness of the first region 103a and the maximum thickness of the third region 103c. The top surface and a side surface of the oxide semiconductor film 103 in the third region 103c are in contact with the protective insulating film 108.

Each of the first region 103a and the third region 103c is formed on a source electrode 105a side and on a drain electrode 105b side. In other words, a pair of first regions 103a is provided to sandwich the second region 103b and a pair of third regions 103c therebetween and the pair of third regions 103c is provided to sandwich the second region 103b therebetween.

Note that the pair of first regions 103a and the pair of third regions 103c are each provided symmetrically on the source electrode 105a side and the drain electrode 105b side in FIGS. 1A and 1B, but are not necessarily provided symmetrically.

As illustrated in FIG. 1B, the thickness of the first region 103a is T1 and the thickness of the second region 103b is T2. The thickness T2 is smaller than the thickness T1. For example, the thickness T1 can be greater than or equal to 20 nm and less than or equal to 300 nm, and the thickness T2 can be greater than or equal to 5 nm and less than or equal to 50 nm. Here, the thickness of the second region 103b is the thickness T2 and is substantially uniform. Note that in the case where the edge portion of the oxide semiconductor film 103 in the first region 103a is tapered as illustrated in FIG. 1A, the thickness of the tapered edge portion is smaller than the thickness T1.

The oxide semiconductor film 103 includes a step between the first region 103a with the thickness T1 and the second region 103b with the thickness T2, and the step is in the third region 103c. The top surface and the side surface of oxide semiconductor film 103 in the third region 103c are in contact with the protective insulating film 108. That is, the oxide semiconductor film 103 has a depression portion in the second region 103b and part of the third region 103c. The depression portion of the oxide semiconductor film 103 in the second region 103b and part of the third region 103c is in contact with the protective insulating film 108.

The second region 103b and the pair of third regions 103c collectively function as a channel formation region of the transistor 110. As illustrated in FIG. 1B, the distance between the source electrode 105a and the drain electrode 105b, that is, the collective length of the second region 103b and the pair of third regions 103c in the channel length direction, corresponds to a channel length L. A distance L1 between the first region 103a and the second region 103b is preferably longer than the channel length L by a factor greater than or equal to 0.059 and less than 0.5.

An oxide semiconductor used for the oxide semiconductor film 103 contains at least indium (In), zinc (Zn), or tin (Sn). In particular, In and Zn are preferably contained. As a stabilizer for reducing variations in electric characteristics of a transistor including the oxide semiconductor, gallium (Ga) is preferably contained in addition to In and Zn. Tin (Sn) is preferably contained as a stabilizer. Hafnium (Hf) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, or an In—Sn—Hf—Zn-based oxide can be used.

Note that here, for example, an "In—Ga—Zn-based oxide" means an oxide containing In, Ga, and Zn as its main components and there is no limitation on the ratio of In:Ga:Zn. The In—Ga—Zn-based oxide may contain a metal element other than the In, Ga, and Zn.

As the In—Ga—Zn-based oxide, for example, an oxide containing In, Ga, and Zn at an atomic ratio of 1:1:1, 1:3:2, 3:1:2, or 2:1:3, or an oxide having a composition in the neighborhood of the above composition can be used.

A material represented by $InMO_3(ZnO)_m$ (m>0, where m is not an integer) may be used as the oxide semiconductor. Note that M represents one or more metal elements selected from Ga, Fe, Mn, and Co.

Note that the composition of the oxide semiconductor is not limited to those described above and a material with an appropriate composition may be used as the oxide semiconductor depending on needed semiconductor characteristics (e.g., mobility, threshold voltage, and variation). To obtain the needed semiconductor characteristics, it is preferable that the carrier concentration, the impurity concentration, the defect density, the atomic ratio of a metal element to oxygen, the interatomic distance, the density, and the like be set to appropriate values.

The oxide semiconductor film 103 is preferably highly purified by sufficient removal of impurities such as hydrogen or sufficient supply with oxygen so as to be supersaturated with oxygen. Specifically, the hydrogen concentration in the oxide semiconductor film 103 is lower than or equal to $5\times10^{19}$ atoms/cm$^3$, preferably lower than or equal to $5\times10^{18}$ atoms/cm$^3$, further preferably lower than or equal to $5\times10^{17}$ atoms/cm$^3$. Note that the hydrogen concentration in the oxide semiconductor film 103 is measured by secondary ion mass spectrometry (SIMS).

The oxide semiconductor film 103 immediately after being formed is preferably in a supersaturated state in which the oxygen content is in excess of that of that in the stoichiometric composition. Here, for sufficient supply of oxygen to make the film in a supersaturated state, an insulating film containing excess oxygen (such as a $SiO_x$ film) is preferably provided so as to cover and be in contact with the oxide semiconductor film 103. In this embodiment, the gate insulating film 102 and the protective insulating film 108 preferably contain excess oxygen.

The oxide semiconductor film 103 is in a single crystal state, a polycrystalline (also referred to as polycrystal) state, an amorphous state, or the like.

The oxide semiconductor film 103 may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, the oxide semiconductor film 103 may include a CAAC-OS. In the CAAC-OS, for example, c-axes are aligned, and a-axes and/or b-axes are not macroscopically aligned. The oxide semiconductor film 103 is preferably a CAAC-OS film.

For example, the oxide semiconductor film 103 may include microcrystal. Note that an oxide semiconductor film including microcrystal (also referred to as a microcrystalline oxide semiconductor film) includes, for example, microcrystal (also referred to as nanocrystal) with a size greater than or equal to 1 nm and less than 10 nm.

For example, the oxide semiconductor film 103 may include an amorphous part. Note that an oxide semiconductor film including an amorphous part (also referred to as an amorphous oxide semiconductor film) has, for example, disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

Note that in most cases, a crystal part in the CAAC-OS film fits inside a cube whose one side is less than 100 nm. In an image obtained with a transmission electron microscope (TEM), a boundary between crystal parts in the CAAC-OS film is not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

Note that part of oxygen included in the oxide semiconductor film may be substituted with nitrogen.

In an oxide semiconductor having a crystal part such as the CAAC-OS, defects in the bulk can be further reduced and when the surface flatness of the oxide semiconductor is improved, mobility higher than that of an oxide semiconductor in an amorphous state can be obtained. To improve the surface flatness, the oxide semiconductor is preferably formed over a flat surface. Specifically, the oxide semiconductor may be formed over a surface with an average surface roughness ($R_a$) of less than or equal to 1 nm, preferably less than or equal to 0.3 nm, further preferably less than or equal to 0.1 nm.

Note that the average surface roughness ($R_a$) is obtained by expanding, into three dimensions, arithmetic mean surface roughness that is defined by JIS B 0601:2001 (ISO4287: 1997) so as to be able to apply it to a curved surface. In addition, $R_a$ can be expressed as an "average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| dx dy$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). Further, $S_0$ represents the area of a rectangle which is obtained by projecting the specific surface on the xy plane, and $Z_0$ represents the height of the reference surface (the average height of the specific surface). Note that $R_a$ can be measured using an atomic force microscope (AFM).

Note that since the transistor 110 described in this embodiment is a bottom-gate transistor, the substrate 100, the gate electrode 101, and the gate insulating film 102 are located below the oxide semiconductor film 103. Accordingly, planarization treatment such as CMP treatment may be performed after the formation of the gate electrode 101 and the gate insulating film 102 to obtain the above flat surface.

By the way, in the inverted-staggered transistor with the bottom-gate structure including the oxide semiconductor film, the negative threshold voltage due to a negative shift and normally-on characteristics of the transistor due to the negative threshold voltage are significant problems.

As one of factors in such a negative threshold voltage, the electric field concentration in the vicinity of the interface between the oxide semiconductor film and the protective insulating film can be given. This is probably because positively charged mobile ions and the like are drawn to the vicinity of the interface between the protective insulating film and the oxide semiconductor film by the extreme concentration of the electric field at an end face portion of the source electrode or the drain electrode which is in contact with the top surface of the oxide semiconductor film, and negative charges in the oxide semiconductor film are drawn by the positive charges, leading to formation of a parasitic channel even when a negative gate voltage is applied.

Thus, the semiconductor device described in this embodiment includes the oxide semiconductor film 103 having the first region 103a, the second region 103b, and the third region 103c as described above, so that the electric field can be reduced at least in the vicinity of the second region 103b which functions as part of a channel formation region.

Here, verification results obtained by calculation using a model, which indicate that, with a transistor including the oxide semiconductor film 103 having the first region 103a, the second region 103b, and the third region 103c, the electric field concentration can be reduced at least in the vicinity of the second region 103b which functions as part of a channel formation region are described. Specifically, potential distribution in the vicinity of a drain electrode at the time of application of gate bias was calculated using a model of transistors which are each similar to the transistor 110 illustrated in FIGS. 1A and 1B. For the calculation, simulation software (Atlas) produced by Silvaco, Inc. was used.

Figure 11:
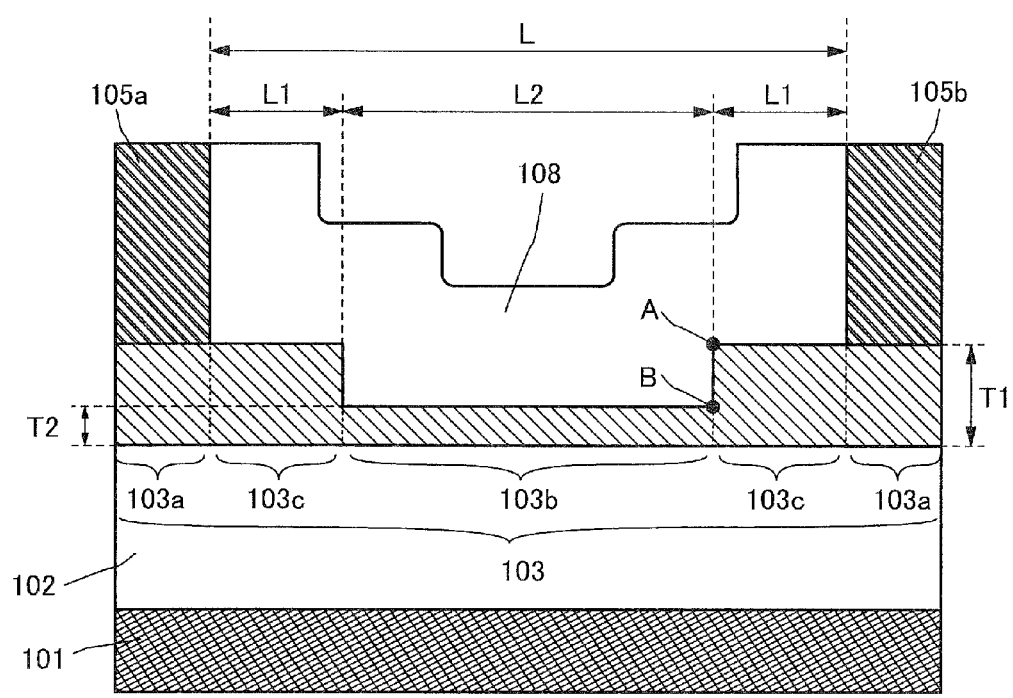
FIG. 11 illustrates a model of transistors used for calculation.

FIG. 11 illustrates the model of the transistors used for the calculation. Note that components of the model of the transistors illustrated in FIG. 11 are denoted by the same reference numerals as those of the transistor 110 illustrated in FIGS. 1A and 1B.

The model of the transistors illustrated in FIG. 11 includes the gate insulating film 102 over the gate electrode 101; the oxide semiconductor film 103 which includes the first region 103a, the second region 103b, and the third region 103c and is over the gate insulating film 102; the source electrode 105a and the drain electrode 105b over the first region 103a; and the protective insulating film 108 over the second region 103b and the third region 103c.

Conditions for forming each components of the model of the transistors illustrated in FIG. 11 are described below. The work function of the gate electrode 101 was 5.0 eV. The work functions of the source electrode 105a and the drain electrode 105b were 4.6 eV. The thickness of the gate insulating film 102 was 250 nm. In the oxide semiconductor film 103, the band gap was 3.15 eV, the electron affinity was 4.6 eV, the relative permittivity was 15, the electron mobility was 10 $cm^2/V \cdot s$, and the donor density was $1 \times 10^{16}$ $cm^{-3}$. The thickness of the protective insulating film 108 was 300 nm. The thickness T1 of the first region 103a and the thickness T2 of the second region 103b were 35 nm and 10 nm, respectively. An angle θ (see FIG. 4A) of the step provided in the third region 103c was 90°. A length L2 of the second region 103b in the channel length direction was 3 μm.

In the above transistors, the distances L1 between the first regions 103a and the second regions 103b were 0 μm, 0.2 μm, 0.4 μm, 0.6 μm, 0.8 μm, and 1.0 μm.

Figure 12:
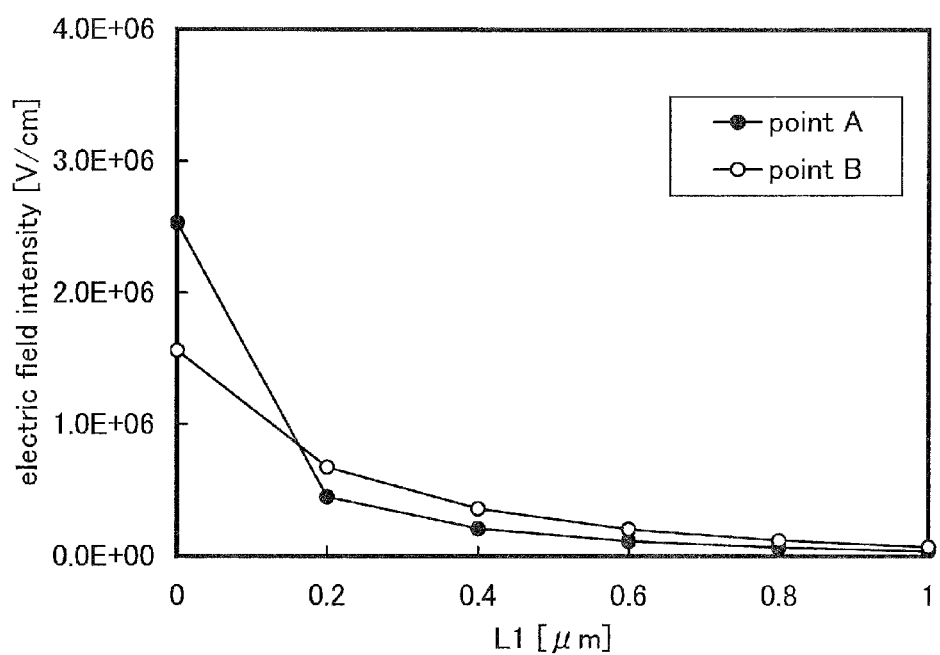
FIG. 12 is a graph of the electric field intensity, which is obtained by calculation.

In each transistor, potential distribution was calculated under the conditions where the gate voltage was −30 V, the drain voltage was 0 V, and the source voltage was 0 V, and then, the electric field intensities at a point A and a point B located at the boundary between the second region 103b and the third region 103c were calculated. FIG. 12 shows calculation results of the electric field intensities at the point A and the point B in each transistor. In the graph of FIG. 12, the horizontal axis indicates the distance L1 [μm] and the vertical axis indicates the electric field intensity [V/cm].

FIG. 12 indicates that the electric field intensities at the point A and the point B are reduced as the distance L1 between the first region 103a and the second region 103b is increased. In particular, in the transistors of this embodiment with a distance L1 of 0.2 μm or more, the electric field intensity at the point A is reduced by a factor of five and the electric field intensity at the point B is reduced by a factor of two, as compared with a transistor whose distance L1 is 0 μm, that is, a transistor without the third region.

Here, the channel length L is 3.4 μm when the distance L1 is 0.2 μm; thus, it can be said that the electric fields at the point A and the point B can be sufficiently reduced when the distance L1 between the first region 103a and the second region 103b is longer than the channel length L by a factor of 0.059 or more. Since the point A and the point B are located at the boundary between the second region 103b and the third region 103c, it can be said that the electric fields can be sufficiently reduced also in the vicinity of the second region 103b.

The above results show that in the transistor including the oxide semiconductor film 103 having the pair of first regions 103a, the pair of third regions 103c, and the second region 103b, the electric field can be reduced at least in the vicinity of the second region 103b. The pair of first regions 103a having a large thickness overlaps with the source electrode 105a and the drain electrode 105b. The pair of third regions 103c is provided between the pair of first regions 103a. The second region 103b which is thinner than the pair of first regions 103a is provided between the pair of third regions 103c.

Since the second region 103b is located in the middle of the channel formation region in the transistor 110, the electric field concentration in the second region 103b is reduced and the formation of a parasitic channel is suppressed, whereby the threshold voltage of the transistor 110 can be prevented from being a negative value.

In such a manner, a transistor including an oxide semiconductor film, in which the threshold voltage is prevented from being a negative value, can be provided. Further, a normally-off transistor including an oxide semiconductor film, in which the threshold voltage is prevented from being a negative value, can also be provided. Furthermore, a high quality semiconductor device including the transistor having an oxide semiconductor film can be provided.

Next, an example of the method for manufacturing the transistor 110 illustrated in FIGS. 1A and 1B will be described with reference to cross-sectional views in FIGS. 2A to 2C and FIGS. 3A and 3B.

First, a conductive film is formed over the substrate 100 having an insulating surface and etched to form the gate electrode 101 (including a wiring formed using the same layer as the gate electrode 101). Note that the conductive film may be etched using either dry etching or wet etching, or using both dry etching and wet etching.

There is no particular limitation on the substrate that can be used as the substrate 100 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 100. Any of these substrates provided with a semiconductor element may be used as the substrate 100.

The semiconductor device may be manufactured using a flexible substrate as the substrate 100. To manufacture a flexible semiconductor device, the transistor 110 including the oxide semiconductor film 103 may be directly formed over a flexible substrate; or alternatively, the transistor 110 including the oxide semiconductor film 103 may be formed over a manufacturing substrate and then separated and transferred to a flexible substrate. Note that in order to separate the transistor 110 including the oxide semiconductor film from the manufacturing substrate and transfer it to the flexible substrate, a separation layer may be provided between the manufacturing substrate and the transistor 110.

The gate electrode 101 can be formed using a metal material such as molybdenum, titanium, tantalum, tungsten, aluminum, copper, chromium, neodymium, or scandium, or an alloy material which contains any of these materials as its main component. Alternatively, a semiconductor film typified by a polycrystalline silicon film doped with an impurity element such as phosphorus, or a silicide film such as a nickel silicide film may be used as the gate electrode 101. The gate electrode 101 may have a single-layer structure or a stacked-layer structure.

The gate electrode 101 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode 101 has a stacked-layer structure of the above conductive material and the above metal material.

As the gate electrode 101, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. In the case where the gate electrode 101 has a stacked-layer structure, it is particularly preferable to use any of these films for a layer which is in contact with the gate insulating film 102. The above films each have a work function of 5 eV or higher, preferably 5.5 eV or higher, which enables the threshold voltage of the transistor to be close to the positive side when used for the gate electrode, so that a normally-off switching element can be provided.

A base insulating film may be formed over the substrate 100 and then the gate electrode 101 may be formed thereover. The base insulating film can be formed by a plasma CVD method, a sputtering method, or the like using an oxide having an insulating property such as silicon oxide, silicon oxynitride, aluminum oxide, aluminum oxynitride, hafnium oxide, or gallium oxide; a nitride having an insulating property such as silicon nitride, silicon nitride oxide, aluminum nitride, or aluminum nitride oxide; or a mixed material of any of these materials. Note that in this specification and the like, "silicon oxynitride" contains more oxygen than nitrogen, and "silicon nitride oxide" contains more nitrogen than oxygen.

Next, the gate insulating film 102 is formed over the gate electrode 101.

The gate insulating film 102 can be formed by a sputtering method, a molecular beam epitaxy (MBE) method, a CVD method, a pulsed laser deposition method, an atomic layer deposition (ALD) method, or the like as appropriate. The gate insulating film 102 may be formed using a sputtering apparatus which performs deposition with surfaces of a plurality of substrates set substantially perpendicular to a surface of a sputtering target.

The gate insulating film 102 can be formed using a silicon oxide film, a gallium oxide film, an aluminum oxide film, a silicon nitride film, a silicon oxynitride film, an aluminum oxynitride film, a silicon nitride oxide film, a Ga—Zn-based oxide film, or the like. The gate insulating film 102 may have a single-layer structure or a stacked-layer structure.

In the case where a gallium oxide film is used as the gate insulating film 102, for example, a metal organic chemical vapor deposition (MOCVD) method can be employed. As a source gas, trimethylgallium, triethylgallium, or the like can be used. With such an MOCVD method, a gallium oxide film can be formed without generation of a powdery substance.

For example, the gate insulating film 102 may have a structure in which a gallium oxide film is stacked over a silicon nitride film. In particular, when the base insulating film is not provided, diffusion of impurities from the substrate 100 can be prevented by the use of a film containing much nitrogen for the gate insulating film 102. When a glass substrate is used as the substrate 100, diffusion of impurities, such as moisture or metal elements, is particularly remarkable; thus, a film containing much nitrogen is preferably used for the gate insulating film 102 in that case. Further, when a film containing a metal element with high diffusibility, such as copper, is used as the gate electrode 101, the metal element can be blocked by the use of a film containing much nitrogen for the gate insulating film 102, which is preferable.

The gate insulating film 102 can be formed using a high-k material such as hafnium oxide, yttrium oxide, hafnium silicate ($HfSi_xO_y$, (x>0, y>0)), hafnium silicate to which nitrogen is added ($HfSiO_xN_y$, (x>0, y>0)), hafnium aluminate ($HfAl_xO_y$, (x>0, y>0)), or lanthanum oxide, whereby gate leakage current can be reduced.

It is preferable that the gate insulating film 102 contain oxygen in a portion which is in contact with the oxide semiconductor film 103. In particular, the gate insulating film 102 preferably contains a large amount of oxygen which exceeds at least the amount of oxygen in the stoichiometric composition in the film (bulk). Here, oxygen can be introduced into the gate insulating film 102 by an ion implantation method, an ion doping method, a plasma immersion ion implantation method, plasma treatment, or the like.

When the gate insulating film 102 containing much (excess) oxygen, which serves as an oxygen supply source, is provided so as to be in contact with the oxide semiconductor film 103, oxygen can be supplied from the gate insulating film 102 to the oxide semiconductor film 103. Heat treatment is preferably performed in the state where the gate insulating film 102 is at least partly in contact with the oxide semiconductor film 103 to supply oxygen to the oxide semiconductor film 103.

By supply of oxygen to the oxide semiconductor film 103, oxygen vacancies in the film can be filled. Further, the gate insulating film 102 is preferably formed in consideration of the size of a transistor to be formed and the step coverage with the gate insulating film 102.

Next, an oxide semiconductor film is formed over the gate insulating film 102.

To prevent the oxide semiconductor film from containing hydrogen or water as much as possible in the step of forming the oxide semiconductor film, it is preferable to heat the substrate provided with the gate insulating film 102 in a preheating chamber in a sputtering apparatus as a pretreatment for formation of the oxide semiconductor film so that impurities such as hydrogen and moisture adsorbed on the substrate and the gate insulating film 102 are eliminated and removed. As an exhaustion unit provided in the preheating chamber, a cryopump is preferable.

Planarization treatment may be performed on a region of the gate insulating film 102 which is to be in contact with the island-shaped oxide semiconductor film 103 which is described later. The planarization treatment may be, but not particularly limited to, polishing treatment (such as chemical mechanical polishing (CMP)), dry etching treatment, or plasma treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to a surface of the gate insulating film 102.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the gate insulating film 102.

The oxide semiconductor film can be formed by a sputtering method, an MBE method, a CVD method, a pulsed laser deposition method, an ALD method, or the like as appropriate. The oxide semiconductor film may be formed using a sputtering apparatus which performs deposition with surfaces of a plurality of substrates set substantially perpendicular to a surface of a sputtering target.

The oxide semiconductor film is preferably formed to have a thickness greater than or equal to 20 nm and less than or equal to 300 nm.

The oxide semiconductor film is preferably formed under a condition such that much oxygen is contained (for example, by a sputtering method in an atmosphere where the proportion of oxygen is 100%) so as to be a film containing much oxygen (preferably including a region containing oxygen in excess of the stoichiometric composition of the oxide semiconductor in a crystalline state).

It is preferable that a high-purity gas from which impurities such as hydrogen, water, a hydroxyl group, and hydride are removed be used as a sputtering gas for the formation of the oxide semiconductor film.

The substrate is held in a deposition chamber kept under reduced pressure. Then, a sputtering gas from which hydrogen and moisture are removed is introduced into the deposition chamber while moisture remaining therein is removed, and the oxide semiconductor film is formed over the gate insulating film 102 with the use of a target containing any of the above materials that can be used for the oxide semiconductor film 103. To remove moisture remaining in the deposition chamber, an entrapment vacuum pump such as a cryopump, an ion pump, or a titanium sublimation pump is preferably used. As an exhaustion unit, a turbo molecular pump provided with a cold trap may be used. In the deposition chamber which is evacuated with the cryopump, for example, a hydrogen atom, a compound containing a hydrogen atom, such as water ($H_2O$), (more preferably, also a compound containing a carbon atom), and the like are evacuated, whereby the concentration of an impurity contained in the oxide semiconductor film deposited in the deposition chamber can be reduced.

Further, in the case where the oxide semiconductor film is formed by a sputtering method, the relative density (the fill rate) of a metal oxide target which is used for forming the oxide semiconductor film is greater than or equal to 90% and less than or equal to 100%, preferably greater than or equal to 95% and less than or equal to 100%. With the use of a metal oxide target with a high relative density, a dense oxide semiconductor film can be deposited.

To reduce the impurity concentration in the oxide semiconductor film, it is also effective to form the oxide semiconductor film while the substrate 100 is kept at high temperatures. The temperature at which the substrate 100 is heated may be higher than or equal to 150° C. and lower than or equal to 450° C., preferably higher than or equal to 200° C. and lower than or equal to 350° C. A crystalline oxide semiconductor film can be formed by heating the substrate at high temperatures in the formation.

It is preferable to form the gate insulating film 102 and the oxide semiconductor film in succession so as not to expose the gate insulating film 102 to the air. Forming the gate insulating film 102 and the oxide semiconductor film in succession so as not to expose the gate insulating film 102 to the air can prevent impurities such as hydrogen and moisture from being adsorbed to the surface of the gate insulating film 102.

The oxide semiconductor film immediately after being formed is preferably in a supersaturated state in which the proportion of oxygen is higher than that in the stoichiometric composition. For example, in the case where the oxide semiconductor film is deposited using a sputtering method, the deposition is preferably performed under the condition where the proportion of oxygen in a deposition gas is high, in particular, in an oxygen atmosphere (oxygen gas: 100%). The deposition under the condition where the proportion of oxygen in a deposition gas is high, in particular, in an atmosphere containing an oxygen gas at 100% can reduce release of Zn from the film even when the deposition temperature is, for example, higher than or equal to 300° C.

There are three methods for obtaining a CAAC-OS film when the CAAC-OS film is used as the oxide semiconductor film. The first method is to deposit an oxide semiconductor film at a deposition temperature higher than or equal to 200° C. and lower than or equal to 450° C., thereby obtaining c-axis alignment substantially perpendicular to a surface. The second method is to form a thin oxide semiconductor film and then subject the film to heat treatment performed at a temperature higher than or equal to 200° C. and lower than or equal to 700° C., thereby obtaining c-axis alignment substantially perpendicular to a surface. The third method is to form a first thin oxide semiconductor film, subject the film to heat treatment performed at a temperature higher than or equal to 200° C. and lower than or equal to 700° C., and then form a second oxide semiconductor film, thereby obtaining c-axis alignment substantially perpendicular to a surface.

Further, heat treatment for removal of excess hydrogen (including water and a hydroxyl group) (dehydration or dehydrogenation treatment) may be performed on the oxide semiconductor film. The temperature of the heat treatment is higher than or equal to 300° C. and lower than or equal to 700° C., or lower than the strain point of the substrate. The heat treatment can be performed under reduced pressure, a nitrogen atmosphere, or the like.

In the case of using a crystalline oxide semiconductor film as the oxide semiconductor film, heat treatment for crystallization may be performed.

In this embodiment, the substrate is introduced into an electric furnace, which is one of heat treatment apparatuses, and the oxide semiconductor film is subjected to heat treatment at 450° C. in a nitrogen atmosphere for one hour and further at 450° C. in an atmosphere of nitrogen and oxygen for one hour.

Note that the heat treatment apparatus used is not limited to an electric furnace, and a device for heating a processing object by heat conduction or heat radiation from a heating element such as a resistance heating element may alternatively be used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating a processing object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, an inert gas which does not react with a processing object by the heat treatment, such as nitrogen or a rare gas like argon, is used.

For example, as the heat treatment, GRTA may be performed as follows. The substrate is put in an inert gas heated at a high temperature of 650° C. to 700° C., is heated for several minutes, and is taken out of the inert gas.

Note that in the heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is preferably 6N (99.9999%) or higher, further preferably 7N (99.99999%) or higher (i.e., the impurity concentration is preferably 1 ppm or lower, further preferably 0.1 ppm or lower).

In addition, after the oxide semiconductor film is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, further preferably less than or equal to 10 ppb, according to measurement with a dew point meter of a cavity ring down laser spectroscopy (CRDS) system) may be introduced into the same furnace. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component material of the oxide semiconductor and that is reduced by the step for removing an impurity for dehydration or dehydrogenation, so that the oxide semiconductor film can be a high-purified, i-type (intrinsic) oxide semiconductor film.

Note that the timing of the heat treatment for dehydration or dehydrogenation may be after formation of the oxide semiconductor film or after formation of the island-shaped oxide semiconductor film 103 which is described later.

The heat treatment for dehydration or dehydrogenation may be performed plural times and may also serve as another heat treatment.

When the heat treatment for dehydration or dehydrogenation is performed in the state where the gate insulating film 102 is covered with the oxide semiconductor film which has not been processed into the island-shaped oxide semiconductor film 103, oxygen included in the gate insulating film 102 can be prevented from being released to the outside by the heat treatment, which is preferable.

Further, oxygen (which includes at least one of an oxygen radical, an oxygen atom, and an oxygen ion) may be introduced into the oxide semiconductor film that has been subjected to the dehydration or dehydrogenation treatment to supply oxygen to the oxide semiconductor film. Here, oxygen can be introduced into the oxide semiconductor film by an ion implantation method, an ion doping method, a plasma immersion ion implantation method, plasma treatment, or the like.

The introduction of oxygen into the oxide semiconductor film is preferably performed after the dehydration or dehydrogenation treatment but not limited thereto. Further, oxygen may be introduced plural times into the oxide semiconductor film subjected to the dehydration or dehydrogenation treatment.

It is preferable that the oxide semiconductor film in the transistor include a region containing oxygen in excess of the stoichiometric composition of the oxide semiconductor in a crystalline state. In this case, the amount of oxygen in the region exceeds that in the stoichiometric composition of the oxide semiconductor. Alternatively, the amount of oxygen in the region exceeds that of the oxide semiconductor in a single crystal state. In some cases, oxygen may exist between lattices of the oxide semiconductor.

As described above, the oxide semiconductor film is preferably highly purified by sufficient removal of impurities such as hydrogen or sufficient supply with oxygen so as to be supersaturated with oxygen. Specifically, the hydrogen concentration in the oxide semiconductor film is lower than or equal to $5 \times 10^{19}$ atoms/cm$^3$, preferably lower than or equal to $5 \times 10^{18}$ atoms/cm$^3$, further preferably lower than or equal to $5 \times 10^{17}$ atoms/cm$^3$.

By removing hydrogen or moisture from the oxide semiconductor to highly purify the oxide semiconductor so as not to contain impurities as much as possible, and supplying oxygen to fill oxygen vacancies therein, the oxide semiconductor can be turned into an i-type (intrinsic) oxide semiconductor or a substantially i-type (intrinsic) oxide semiconductor. This enables the Fermi level ($E_f$) of the oxide semiconductor to be at the same level as the intrinsic Fermi level ($E_i$) thereof. Accordingly, by using the oxide semiconductor film in a transistor, variation in the threshold voltage $V_{th}$ of the transistor due to oxygen vacancies and a shift of the threshold voltage $\Delta V_{th}$ can be reduced.

Figure 2A:
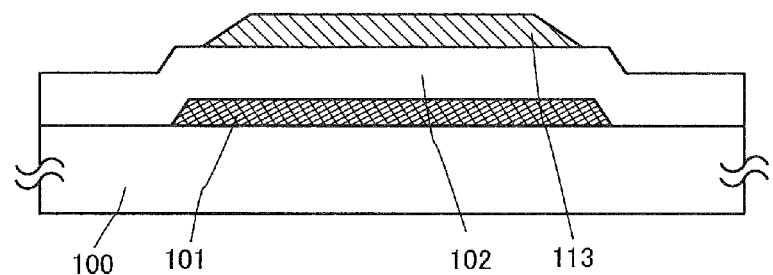
FIGS. 2A to 2C are cross-sectional views illustrating one embodiment of a method for manufacturing a semiconductor device.

Next, the above oxide semiconductor film is processed by a photolithography process to form an island-shaped oxide semiconductor film 113 (see FIG. 2A). Here, the island-shaped oxide semiconductor film 113 may have a tapered end face portion. The taper angle can be set as appropriate. For example, the taper angle can be greater than or equal to 20° and less than or equal to 50°. Note that a taper angle is a tilt angle formed by a side surface and the bottom surface of a film having a tapered shape (e.g., the oxide semiconductor film 113), or by the side surface and a substrate surface over which the film is provided, in the case where the film is observed from the direction perpendicular to a cross section (the plane perpendicular to a surface of the substrate).

A resist mask which is used in the formation of the island-shaped oxide semiconductor film 113 may be formed by an ink jet method. Formation of the resist mask by an inkjet method needs no photomask; thus, manufacturing cost can be reduced.

Note that the etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. Alternatively, ITO-07N (produced by KANTO CHEMICAL CO., INC.) may be used. It is also possible to employ dry etching using an inductively coupled plasma (ICP) etching method.

Next, a conductive film 115 which is to be a source electrode and a drain electrode (including a wiring formed in the same layer as the source electrode and the drain electrode) is formed over the gate electrode 101, the gate insulating film 102, and the oxide semiconductor film 113.

The conductive film 115 used for the source electrode and the drain electrode is formed using a material which can withstand heat treatment performed later. For example, a metal film containing an element selected from aluminum (Al), chromium (Cr), copper (Cu), tantalum (Ta), titanium (Ti), molybdenum (Mo), and tungsten (W), a metal nitride film containing any of the above elements as its component (e.g., a titanium nitride film, a molybdenum nitride film, or a tungsten nitride film), or the like can be used. It is also possible to use a structure in which a film of a high-melting-point metal such as Ti, Mo, or W or a metal nitride film thereof (e.g., a titanium nitride film, a molybdenum nitride film, or a tungsten nitride film) is stacked over and/or below a metal film of Al, Cu, or the like. Alternatively, the conductive film 115 used for the source electrode and the drain electrode may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), or any of these metal oxide materials containing silicon oxide can be used.

Figure 2B:
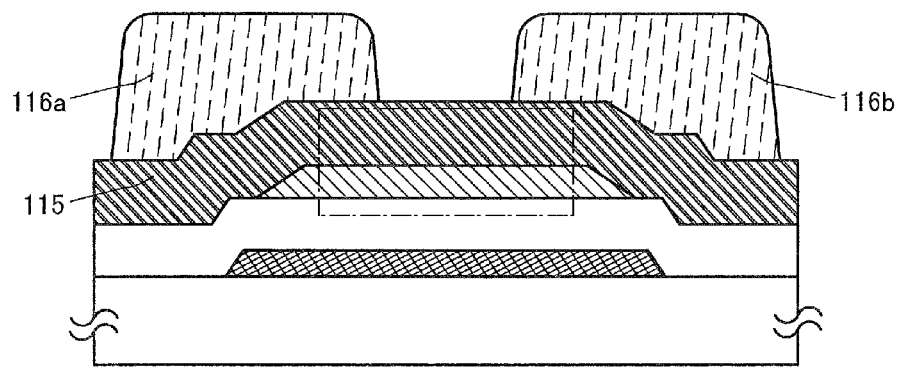

Then, a resist mask 116a and a resist mask 116b are formed over the conductive film 115 by a photolithography process (see FIG. 2B).

Ultraviolet light, KrF laser light, or ArF laser light is preferably used for light exposure for forming the resist mask. The channel length L of the transistor 110 that is to be completed in a later step is determined by a distance between a lower end of the source electrode 105a and a lower end of the drain electrode 105b that face each other over the oxide semiconductor film 103. In the case where the channel length L is less than 25 nm, the light exposure for forming the resist mask is preferably performed using extreme ultraviolet light having an extremely short wavelength of several nanometers to several tens of nanometers. In the light exposure by extreme ultraviolet light, the resolution is high and the focus depth is large. For these reasons, the channel length L of the transistor completed later can be greater than or equal to 10 nm and less than or equal to 1000 nm, and the operation speed of a circuit can increased.

Figure 2C:
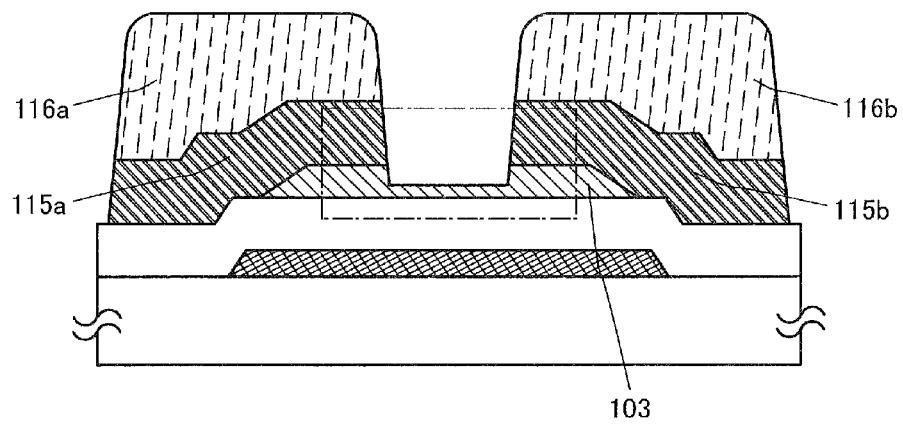

After that, the conductive film 115 is selectively etched using the resist mask 116a and the resist mask 116b to form a conductive film 115a and a conductive film 115b which are used for the source electrode and the drain electrode (see FIG. 2C). At the same time, part of the oxide semiconductor film 113 is also etched, so that the oxide semiconductor film 103 having a depression portion in the middle is formed.

The etching step is preferably performed by dry etching with the use of, for example, a gas containing halogen as an etching gas. A parallel plate RIE (reactive ion etching) method or an ICP (inductively coupled plasma) etching method can be used, for example. To etch the film into a desired shape, etching conditions (the amount of electric power applied to a coil-shaped electrode, the amount of electric power applied to an electrode on a substrate side, the temperature of the electrode on the substrate side, and the like) are adjusted as appropriate.

A gas containing chlorine such as a gas containing chlorine ($Cl_2$), boron trichloride ($BCl_3$), silicon tetrachloride ($SiCl_4$), or carbon tetrachloride ($CCl_4$) can be used as the gas containing halogen. Alternatively, a gas containing fluorine such as a gas containing carbon tetrafluoride ($CF_4$), sulfur hexafluoride ($SF_6$), nitrogen trifluoride ($NF_3$), trifluoromethane ($CHF_3$), or octafluorocyclobutane ($C_4F_8$) can be used as the gas containing halogen. Alternatively, any of the above-mentioned gases to which a rare gas such as helium (He) or argon (Ar) is added, or the like can be used.

Figure 3A:
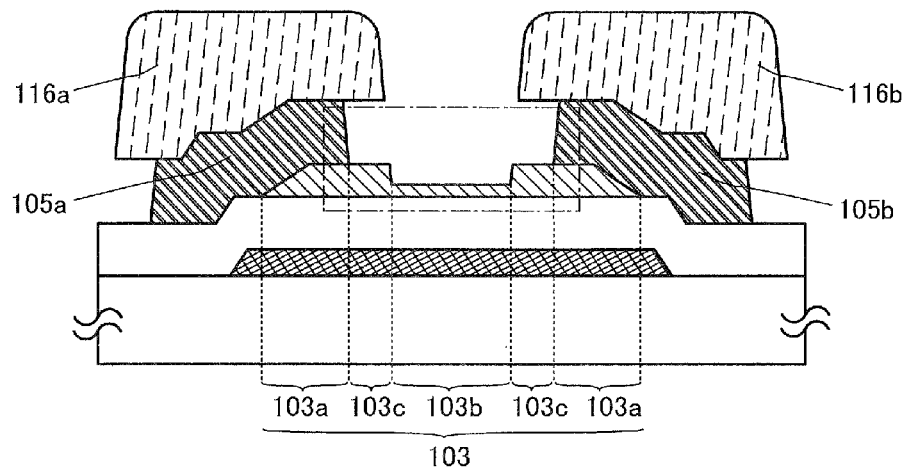
FIGS. 3A and 3B are cross-sectional views illustrating one embodiment of a method for manufacturing a semiconductor device.

Subsequently, the conductive film 115a and the conductive film 115b are etched to form the source electrode 105a and the drain electrode 105b each having a shape whose end face portion do not overlap with the depression portion of the oxide semiconductor film 103 (see FIG. 3A).

In the case where this etching step is performed by wet etching, the conductive film 115a and the conductive film 115b can be etched from side surfaces; thus, the same resist mask 116a and resist mask 116b which are used in the step illustrated in FIG. 2C can be used. In this case, an etchant used for the wet etching is selected as appropriate so that a selectivity ratio of the conductive film 115a and the conductive film 115b with respect to the oxide semiconductor film 103 is sufficiently high.

Note that the etching for forming the source electrode 105a and the drain electrode 105b is not necessarily wet etching. The source electrode 105a and the drain electrode 105b may be formed in the following manner, for example: the resist mask 116a and the resist mask 116b are removed, newly formed resist masks having sizes corresponding to the sizes of the source electrode 105a and the drain electrode 105b are formed, and dry etching is performed. Alternatively, the resist mask 116a and the resist mask 116b may be reduced in size by ashing, which is followed by dry etching.

The source electrode 105a and the drain electrode 105b each having a shape whose end face portion does not overlap with the depression portion of the oxide semiconductor film 103 are formed in such a manner and then the protective insulating film 108 described later is formed, whereby the oxide semiconductor film 103 including the pair of first regions 103a having large thicknesses which overlaps with the source electrode 105a and the drain electrode 105b, the pair of third regions 103c provided between the pair of first regions 103a, and the second region 103b which is thinner than the pair of first regions 103a and is provided between the pair of third regions 103c can be formed.

With the oxide semiconductor film 103 having such a shape, electric field can be reduced at least in the vicinity of the second region 103b and formation of a parasitic channel can be suppressed, so that the threshold voltage of the transistor 110 can be prevented from being a negative value.

Figure 3B:
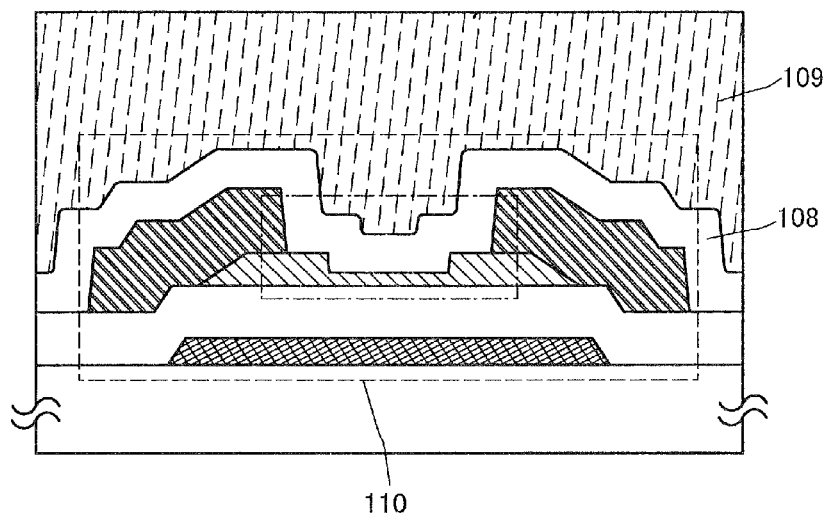

Next, the protective insulating film 108 is formed to cover the oxide semiconductor film 103, the source electrode 105a, and the drain electrode 105b (see FIG. 3B).

The protective insulating film 108 can be formed by a CVD method, a sputtering method, or the like. As the protective insulating film 108, a single layer or a stack of one or more inorganic insulating films, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, an aluminum nitride oxide film, and a Ga—Zn-based oxide film, can be used.

In the case where the protective insulating film 108 has a stacked-layer structure, a lower layer which is in contact with the oxide semiconductor film 103 is preferably an insulating film containing oxygen, such as a silicon oxide film, a silicon oxynitride film, a hafnium oxide film, a gallium oxide film, or a Ga—Zn-based oxide film. With such an insulating film containing oxygen, the oxide semiconductor film 103 can be supplied with oxygen.

Oxygen (which includes at least one of an oxygen radical, an oxygen atom, and an oxygen ion) may be supplied to such an insulating film containing oxygen by oxygen addition treatment. For the oxygen addition treatment, an ion implantation method, an ion doping method, a plasma immersion ion implantation method, plasma treatment, or the like can be employed. A gas cluster ion beam may be used in the ion implantation method. The substrate may entirely be subjected to the oxygen addition treatment all at once, or may be subjected to the oxygen addition treatment with a moving linear ion beam or the like (by being scanned with the linear ion beam or the like).

In addition, in the case where the protective insulating film 108 has a stacked-layer structure, it is preferable that a dense insulating film such as an aluminum oxide film, an aluminum oxynitride film, an aluminum nitride film, an aluminum nitride oxide film, a silicon nitride film, or a silicon nitride oxide film be provided over the insulating film containing oxygen. With such a dense insulating film, impurities and the like such as hydrogen and moisture can be prevented from entering the oxide semiconductor film 103.

Through the above steps, the transistor 110 described in this embodiment is manufactured (see FIG. 3B).

In addition, the planarization insulating film 109 may be formed in order to reduce surface roughness caused by the transistor 110. For the planarization insulating film 109, an organic material such as a polyimide resin, an acrylic resin, or a benzocyclobutene-based resin can be used. Other than such organic materials, it is also possible to use a low-dielectric constant material (low-k material) or the like. Note that the planarization insulating film 109 may be formed by stacking a plurality of insulating films formed using any of these materials.

For example, an acrylic resin film with a thickness of 1500 nm may be formed as the planarization insulating film 109. The acrylic resin film can be formed in such a manner that an acrylic resin is applied by a coating method and then baked (e.g., at 250° C. in a nitrogen atmosphere for one hour).

Heat treatment may be performed after the planarization insulating film 109 is formed. In this manner, heat treatment may be performed after the formation of the transistor 110. The heat treatment may be performed plural times.

Through the above steps, a transistor including an oxide semiconductor film, in which the threshold voltage is prevented from being a negative value, can be provided. Further, a normally-off transistor including an oxide semiconductor film, in which the threshold voltage is prevented from being a negative value, can also be provided. Furthermore, a high quality semiconductor device including the transistor having an oxide semiconductor film can be provided.

Note that the side surface of the oxide semiconductor film 103 in the third region 103c is hardly inclined in the transistor 110 illustrated in FIGS. 1A and 1B; however, this embodiment is not limited thereto. For example, the oxide semiconductor film 103 has a tapered portion in the third region 103c as illustrated in FIG. 4A in some cases, depending on the selectivity ratio of the conductive film 115a and the conductive film 115b with respect to the oxide semiconductor film 103 in the wet etching in the manufacturing step illustrated in FIG. 3A.

In that case, a taper angle θ in FIG. 4A is preferably, for example, greater than or equal to 30° and less than or equal to 60°. With such a taper angle, the coverage of the oxide semiconductor film 103 with the protective insulating film 108 can be improved, and oxygen can be supplied from the protective insulating film 108 to the oxide semiconductor film 103 more efficiently. Further, in the case where a side edge portion of the oxide semiconductor film 103 is tapered, the taper angle θ may be larger than that of the tapered side edge portion of the oxide semiconductor film 103.

The tapered portion formed in the third region 103c is not necessarily linear as illustrated in FIG. 4A. For example, the tapered portion may include a curved surface whose curvature center is on a substrate 100 side or a curved surface whose curvature center is on a protective insulating film 108 side.

Further, the oxide semiconductor film 103 may include a curved surface in the third region 103c which is sandwiched between the first region 103a overlapping with the source electrode 105a and the drain electrode 105b and the second region 103b whose thickness is substantially uniform and smaller than the maximum thickness of the first region 103a. The maximum thickness of the third region 103c may be larger than the thickness of the second region 103b.

The oxide semiconductor 103 in the third region 103c may have, for example, a linear portion on a second region 103b side and a curved surface whose curvature center is on the substrate 100 side on a first region 103a side, as illustrated in FIG. 4B.

Alternatively, the oxide semiconductor 103 in the third region 103c may have a plurality of steps each having a curved surface whose curvature center is on the protective insulating film 108 side as illustrated in FIG. 4C.

The structures, methods, and the like described in this embodiment can be combined as appropriate with any of the structures, methods, and the like described in the other embodiments.

(Embodiment 2)

A semiconductor device having a display function (also referred to as a display device) can be manufactured using the transistor described in Embodiment 1. Further, part or all of the driver circuitry which includes the transistor can be formed over a substrate where a pixel portion is formed, whereby a system-on-panel can be formed.

Figure 5A:
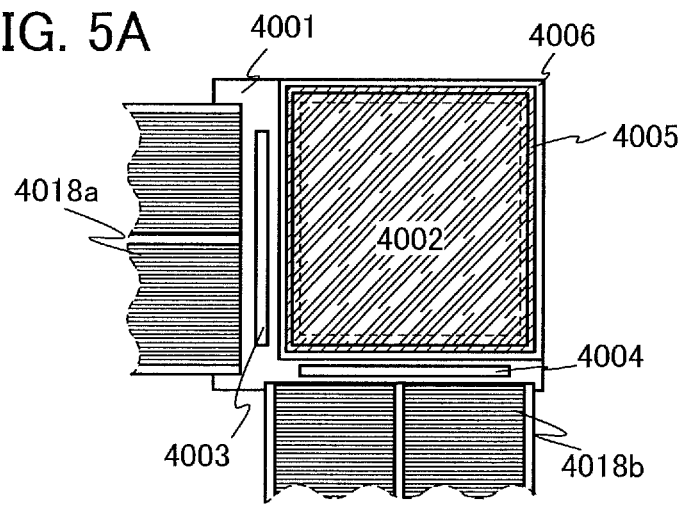
FIGS. 5A to 5C are plan views each illustrating one embodiment of a semiconductor device.

In FIG. 5A, a pixel portion 4002 over a first substrate 4001 is sealed by a sealant 4005 surrounding the pixel portion 4002, the first substrate 4001, and a second substrate 4006. In FIG. 5A, a signal line driver circuit 4003 and a scan line driver circuit 4004 which are formed using a single crystal semiconductor film or a polycrystalline semiconductor film over a substrate separately prepared are mounted in a region that is different from the region surrounded by the sealant 4005 over the first substrate 4001. A variety of signals and potentials are supplied to the signal line driver circuit 4003 and the scan line driver circuit 4004 each of which is separately formed, and the pixel portion 4002 from flexible printed circuits (FPCs) 4018a and 4018b.

Figure 5B:
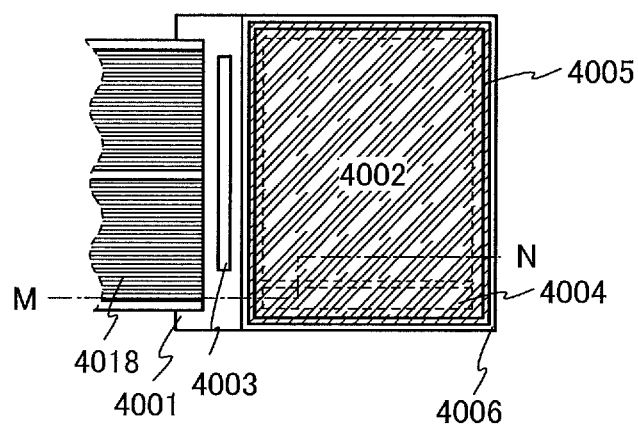
Figure 5C:
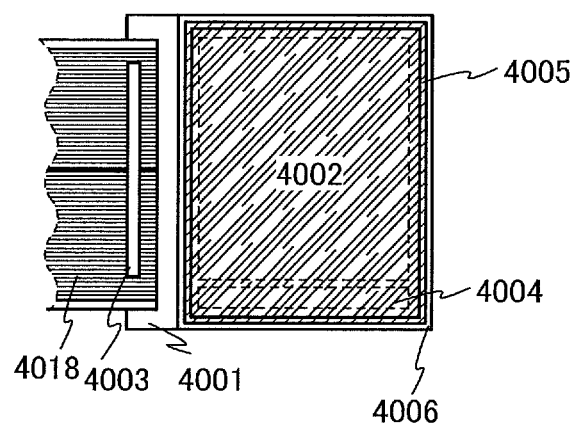

In FIGS. 5B and 5C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 5B and 5C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 5B and 5C, a variety of signals and potentials are supplied to the signal line driver circuit 4003 which is separately formed, the scan line driver circuit 4004, and the pixel portion 4002 from an FPC 4018.

Although FIGS. 5B and 5C each illustrate an example in which the signal line driver circuit 4003 is formed separately and mounted on the first substrate 4001, one embodiment of the present invention is not limited to this structure. The scan line driver circuit may be formed separately and then mounted, or only part of the signal line driver circuit or part of the scan line driver circuit may be formed separately and then mounted.

Note that there is no particular limitation on a connection method of a separately formed driver circuit, and a chip on glass (COG) method, a wire bonding method, a tape automated bonding (TAB) method, or the like can be used. FIG. 5A illustrates an example in which the signal line driver circuit 4003 and the scan line driver circuit 4004 are mounted by a COG method. FIG. 5B illustrates an example in which the signal line driver circuit 4003 is mounted by a COG method. FIG. 5C illustrates an example in which the signal line driver circuit 4003 is mounted by a TAB method.

In addition, the display device includes a panel in which the display element is sealed, and a module in which an IC or the like including a controller is mounted on the panel.

Note that a display device in this specification means an image display device, a display device, or a light source (including a lighting device). Further, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit provided over the first substrate include a plurality of transistors, and the transistor described in Embodiment 1 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Embodiments of the semiconductor device will be described with reference to FIGS. 5A to 5C, FIGS. 6A and 6B, and FIGS. 7A and 7B. FIGS. 7A and 7B correspond to cross-sectional views taken along line M-N in FIG. 5B.

As illustrated in FIGS. 5A to 5C and FIGS. 7A and 7B, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode 4030, and the terminal electrode 4016 is formed using the same conductive film as source and drain electrodes of transistors 4010 and 4011.

The pixel portion 4002 and the scan line driver circuit 4004 which are provided over the first substrate 4001 include a plurality of transistors. FIGS. 7A and 7B illustrate the transistor 4010 included in the pixel portion 4002 and the transistor 4011 included in the scan line driver circuit 4004. In FIG. 7A, a first protective insulating film 4020 and a second protective insulating film 4021 are provided over the transistors 4010 and 4011, and in FIG. 7B, an insulating film 4022 is further provided over the second protective insulating film 4021.

The transistor described in Embodiment 1 can be applied to the transistors 4010 and 4011. In this embodiment, an example in which a transistor having a structure similar to that of the transistor 110 described in Embodiment 1 is used is described. The transistors 4010 and 4011 are inverted staggered transistors with a bottom-gate structure.

In the transistors 4010 and 4011 which can be formed with a structure and a formation method similar to those of the transistor 110 described in Embodiment 1, the threshold voltage is prevented from being a negative value.

Accordingly, the semiconductor devices of this embodiment illustrated in FIGS. 5A to 5C and FIGS. 7A and 7B can be provided as highly reliable semiconductor devices including the normally-off transistors 4010 and 4011 each of which includes an oxide semiconductor film.

A conductive layer may be further provided so as to overlap with a channel formation region in the oxide semiconductor film of the transistor 4011 for the driver circuit. By providing the conductive layer so as to overlap with the channel formation region in the oxide semiconductor film, the amount of change in the threshold voltage of the transistor 4011 between before and after a bias-temperature stress test (BT test) can be further reduced. The conductive layer may have the same potential as or a potential different from that of a gate electrode of the transistor 4011, and can function as a second gate electrode. The potential of the conductive layer may be GND or 0 V, or the conductive layer may be in a floating state.

In addition, the conductive layer has a function of blocking an external electric field, that is, a function of preventing an external electric field (particularly, a function of preventing static electricity) from affecting the inside (a circuit portion including a transistor). The blocking function of the conductive layer can prevent fluctuation in the electric characteristics of the transistor due to an influence of an external electric field such as static electricity.

The transistor 4010 included in the pixel portion 4002 is electrically connected to a display element to form a display panel. There is no particular limitation on the kind of the display element as long as display can be performed, and a variety of kinds of display element can be employed.

FIG. 7A illustrates an example of a liquid crystal display device using a liquid crystal element as a display element. In FIG. 7A, a liquid crystal element 4013 which is a display element includes the first electrode 4030, a second electrode 4031, and a liquid crystal layer 4008. Insulating films 4032 and 4033 serving as alignment films are provided so that the liquid crystal layer 4008 is sandwiched therebetween. The second electrode 4031 is provided on the second substrate 4006 side, and the first electrode 4030 and the second electrode 4031 are stacked with the liquid crystal layer 4008 provided therebetween.

A spacer 4035 is a columnar spacer which is obtained by selective etching of an insulating film, and is provided in order to control the thickness of the liquid crystal layer 4008 (cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. In that case, the liquid crystal layer 4008 is in contact with the first electrode 4030 and the second electrode 4031. A blue phase is one of liquid crystal phases, which is generated just before a cholesteric phase changes into an isotropic phase while the temperature of a cholesteric liquid crystal is increased. The blue phase can be exhibited using a liquid crystal composition which is a mixture of a liquid crystal and a chiral agent. To increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, productivity of the liquid crystal display device can be improved. A transistor including an oxide semiconductor film has a possibility that the electric characteristics of the transistor may fluctuate significantly by the influence of static electricity and deviate from the designed range. Thus, it is more effective to use a liquid crystal composition exhibiting a blue phase for the liquid crystal display device which includes the transistor including an oxide semiconductor film.

The specific resistivity of the liquid crystal material is higher than or equal to $1\times10^9$ $\Omega\cdot$cm, preferably higher than or equal to $1\times10^{11}$ $\Omega\cdot$cm, further preferably higher than or equal to $1\times10^{12}$ $\Omega\cdot$cm. Note that the specific resistivity in this specification is measured at 20° C.

The size of a storage capacitor in the liquid crystal display device is set considering the leakage current of the transistor provided in the pixel portion or the like so that charge can be held for a predetermined period. The size of the storage capacitor may be set considering the off-state current of the transistor or the like.

In the transistor including an oxide semiconductor film, which is disclosed in this specification, the current in an off state (off-state current) can be made small. Accordingly, an electric signal such as an image signal can be held for a longer period, and a writing interval can be set longer in an on state. Thus, the frequency of refresh operation can be reduced, which leads to an effect of suppressing power consumption.

The transistor including an oxide semiconductor film, which is disclosed in this specification, can have relatively high field-effect mobility and thus can operate at high speed. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using the transistor which can operate at high speed in the pixel portion, a high-quality image can be provided.

For the liquid crystal display device, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. This embodiment can also be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. The sizes of display regions may differ between respective dots of color elements. Note that one embodiment of the invention disclosed herein is not limited to the application to a display device for color display; one embodiment of the invention disclosed herein can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. In this embodiment, an example in which an organic EL element is used as the light-emitting element is described.

Inorganic EL elements are classified according to their element structures into a dispersion-type inorganic EL element and a thin-film inorganic EL element. A dispersion-type inorganic EL element has a light-emitting layer in which particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

To extract light emitted from the light-emitting element, at least one of the pair of electrodes has a light-transmitting property. A transistor and the light-emitting element are formed over a substrate. The light-emitting element can have any of the following structures: a top emission structure in which light emission is extracted through a surface opposite to the substrate; a bottom emission structure in which light emission is extracted through a surface on the substrate side; and a dual emission structure in which light emission is extracted through the surface opposite to the substrate and the surface on the substrate side.

Figure 6A:
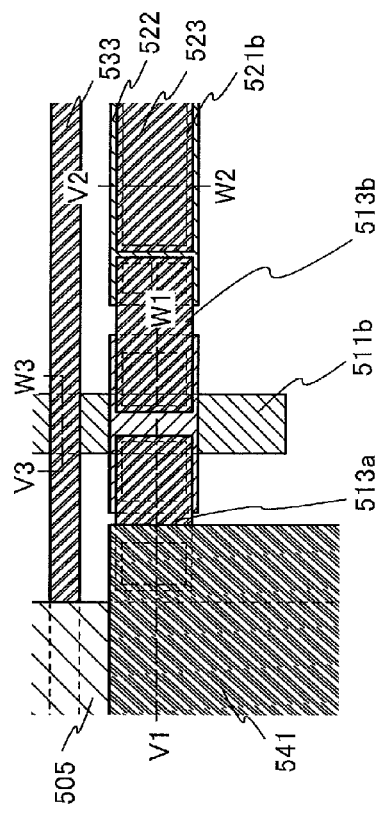
FIGS. 6A and 6B are a plan view and a cross-sectional view illustrating one embodiment of a semiconductor device.
Figure 6B:
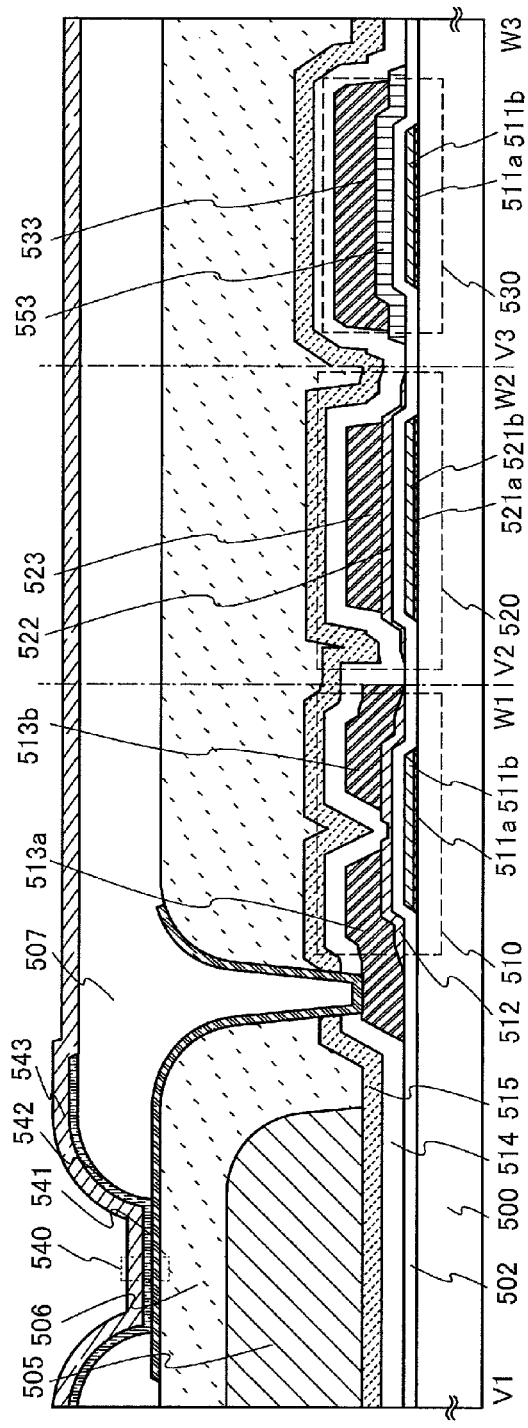

FIGS. 6A and 6B and FIG. 7B illustrate examples of a light-emitting device using a light-emitting element as a display element.

FIG. 6A is a plan view of a light-emitting device and FIG. 6B is a cross-sectional view taken along dashed-dotted lines V1-W1, V2-W2, and V3-W3 in FIG. 6A. Note that an electroluminescent layer 542, a second electrode 543, and the like are not illustrated in the plan view of FIG. 6A.

The light-emitting device illustrated in FIGS. 6A and 6B includes, over a substrate 500, a transistor 510, a capacitor 520, and a wiring layer intersection 530. The transistor 510 is electrically connected to a light-emitting element 540. Note that FIGS. 6A and 6B illustrate a bottom-emission light-emitting device in which light from the light-emitting element 540 is extracted through the substrate 500.

The transistor described in Embodiment 1 can be applied to the transistor 510. In this embodiment, an example in which a transistor having a structure similar to that of the transistor 110 described in Embodiment 1 is used is described. The transistor 510 is an inverted staggered transistor with a bottom-gate structure.

The transistor 510 includes gate electrodes 511a and 511b, a gate insulating film 502, an oxide semiconductor film 512, and conductive layers 513a and 513b functioning as a source electrode and a drain electrode.

In the transistor 510 which can be formed with a structure and a formation method similar to those of the transistor 110 described in Embodiment 1, the threshold voltage is prevented from being a negative value.

Accordingly, the semiconductor devices of this embodiment illustrated in FIGS. 6A and 6B can be provided as a high-quality semiconductor device including the normally-off transistor 510 each of which includes an oxide semiconductor film.

The capacitor 520 includes conductive layers 521a and 521b, the gate insulating film 502, an oxide semiconductor film 522, and a conductive layer 523. The gate insulating film 502 and the oxide semiconductor film 522 are sandwiched between the conductive layer 523 and the conductive layers 521a and 521b, so that the capacitor is formed. Note that in the channel width direction of the transistor 510, edge portions of the conductive layers 521a, 521b and 523 may be located inside edge portions of the oxide semiconductor film 522 as illustrated in FIGS. 6A and 6B.

The wiring layer intersection 530 is an intersection of a conductive layer 533 and the gate electrodes 511a and 511b. The conductive layer 533 and the gate electrodes 511a and 511b intersect with each other with the gate insulating film 502 and an insulating layer 553 provided therebetween. In the structure described in this embodiment, not only the gate insulating film 502 but also the insulating layer 553 can be provided between the conductive layer 533 and the gate electrodes 511a and 511b at the wiring layer intersection 530; thus, parasitic capacitance generated between the conductive layer 533 and the gate electrodes 511a and 511b can be reduced.

In this embodiment, a 30-nm-thick titanium film is used as the gate electrode 511a and the conductive layer 521a, and a 200-nm-thick copper thin film is used as the gate electrode 511b and the conductive layer 521b. Thus, the gate electrode has a stacked-layer structure of a titanium film and a copper thin film.

A 25-nm-thick IGZO film is used as the oxide semiconductor films 512 and 522.

A first protective insulating film 514 and a second protective insulating film 515 are formed over the transistor 510, the capacitor 520, and the wiring layer intersection 530. Over the first protective insulating film 514 and the second protective insulating film 515, a color filter layer 505 is provided in a region overlapping with the light-emitting element 540. An insulating film 506 functioning as a planarization insulating film is provided over the first protective insulating film 514, the second protective insulating film 515, and the color filter layer 505.

The light-emitting element 540 having a stacked-layer structure in which a first electrode 541, the electroluminescent layer 542, and the second electrode 543 are stacked in that order is provided over the insulating film 506. The first electrode 541 is in contact with the conductive layer 513a in an opening formed in the insulating film 506, the first protective insulating film 514, and the second protective insulating film 515, which reaches the conductive layer 513a, whereby the light-emitting element 540 is electrically connected to the transistor 510. Note that a partition 507 is provided so as to cover part of the first electrode 541 and the opening.

As the first protective insulating film 514, for example, a silicon oxynitride film having a thickness greater than or equal to 200 nm and less than or equal to 600 nm, which is formed by a plasma CVD method can be used. As the second protective insulating film 515, an aluminum oxide film formed by a sputtering method can be used. Further, a photosensitive acrylic film having a thickness of 1500 nm and a photosensitive polyimide film having a thickness of 1500 nm can be used as the insulating film 506 and the partition 507, respectively.

As the color filter layer 505, for example, a chromatic light-transmitting resin can be used. As such a chromatic light-transmitting resin, a photosensitive organic resin or a nonphotosensitive organic resin can be used. A photosensitive organic resin layer is preferably used, because the number of resist masks can be reduced, leading to simplification of a process.

Chromatic colors are colors except achromatic colors such as black, gray, and white. The color filter layer is formed using a material which transmits only light of the chromatic color. As the chromatic color, red, green, blue, or the like can be used. Cyan, magenta, yellow, or the like may also be used. "Transmitting only light of the chromatic color" means that the light transmitted through the color filter layer has a peak at a wavelength of light of the chromatic color. The thickness of the color filter layer may be controlled to be optimal as appropriate in consideration of the relationship between the concentration of a coloring material to be contained and the transmittance of light. For example, the color filter layer 505 may have a thickness greater than or equal to 1500 nm and less than or equal to 2000 nm.

In the light-emitting device illustrated in FIG. 7B, a light-emitting element 4513 which is a display element is electrically connected to the transistor 4010 provided in the pixel portion 4002. A structure of the light-emitting element 4513 is not limited to the shown stacked-layer structure including the first electrode 4030, an electroluminescent layer 4511, and the second electrode 4031. The structure of the light-emitting element 4513 can be changed as appropriate depending on a direction in which light is extracted from the light-emitting element 4513, or the like.

Partitions 4510 and 507 can be formed using an organic insulating material or an inorganic insulating material. It is particularly preferable that the partitions 4510 and 507 be formed using a photosensitive resin material to have openings over the first electrodes 4030 and 541, respectively. A sidewall of each opening is formed as a tilted surface with continuous curvature.

The electroluminescent layers 4511 and 542 may be formed using either a single layer or a plurality of layers stacked.

A protective film may be formed over the second electrode 4031 and the partition 4510 and over the second electrode 543 and the partition 507 in order to prevent entry of oxygen, hydrogen, moisture, carbon dioxide, and the like into the light-emitting elements 4513 and 540. As the protective film, a silicon nitride film, a silicon nitride oxide film, a DLC film, or the like can be formed.

Further, the light-emitting elements 4513 and 540 may be covered with respective layers containing an organic compound deposited by an evaporation method so that oxygen, hydrogen, moisture, carbon dioxide, and the like do not enter the light-emitting elements 4513 and 540.

In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), an acrylic resin, a polyimide resin, an epoxy resin, a silicone resin, polyvinyl butyral (PVB), or ethylene vinyl acetate (EVA) can be used. For example, nitrogen is used for the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also referred to as an electrophoretic display device (an electrophoretic display) and is advantageous in that it has the same level of readability as plain paper, it has lower power consumption than other display devices, and it can be made thin and lightweight.

An electrophoretic display device can have a variety of modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode and a second electrode which are electrodes used for a display element, and a potential difference is generated between the first electrode and the second electrode to control orientation of the spherical particles, so that display is performed.

In FIGS. 5A to 5C, FIGS. 6A and 6B, and FIGS. 7A and 7B, a flexible substrate as well as a glass substrate can be used as any of the first substrates 4001 and 500 and the second substrate 4006. For example, a plastic substrate having a light-transmitting property or the like can be used. As the plastic substrate, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is sandwiched between PVF films or polyester films can be used.

In this embodiment, a silicon oxynitride film formed by a plasma CVD method is used as the first protective insulating film 4020, and an aluminum oxide film formed by a sputtering method is used as the second protective insulating film 4021.

The aluminum oxide film provided as the second protective insulating film 4021 over the oxide semiconductor film has a high shielding effect (blocking effect) of preventing penetration of both oxygen and impurities such as hydrogen and moisture.

Thus, in and after the manufacturing process, the aluminum oxide film functions as a protective film for preventing entry of impurities such as hydrogen and moisture, which can cause a change in characteristics, into the oxide semiconductor film and release of oxygen, which is a main component material of the oxide semiconductor, from the oxide semiconductor film.

The insulating films 4022 and 506 serving as planarization insulating films can be formed using an organic material having heat resistance, such as an acrylic resin, a polyimide resin, a benzocyclobutene-based resin, a polyamide resin, or an epoxy resin. Other than such organic materials, it is also possible to use a low-dielectric constant material (a low-k material), a siloxane-based resin, phosphosilicate glass (PSG), borophosphosilicate glass (BPSG), or the like. Note that the insulating films may be formed by stacking a plurality of insulating films formed using any of these materials.

There is no particular limitation on the methods of forming the insulating films 4022 and 506, and the following method or tool (equipment) can be used depending on the material: a sputtering method, an SOG method, spin coating, dipping, spray coating, a droplet discharge method (such as an inkjet method), a printing method (such as screen printing or offset printing), a doctor knife, a roll coater, a curtain coater, a knife coater, or the like.

The display device displays an image with light transmitted from a light source or a display element. Thus, the substrate and the thin films such as the insulating film and the conductive film provided for the pixel portion where light is transmitted have light-transmitting properties with respect to light in the visible-light wavelength range.

The first electrode and the second electrode (each of which may be called a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

The first electrodes 4030 and 541 and the second electrodes 4031 and 543 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or graphene.

The first electrodes 4030 and 541 and the second electrodes 4031 and 543 can be formed using one or plural kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; and nitrides thereof.

In this embodiment, since the light-emitting device illustrated in FIGS. 6A and 6B has a bottom-emission structure, the first electrode 541 has a light-transmitting property and the second electrode 543 has a light-reflecting property. Accordingly, in the case of using a metal film as the first electrode 541, the film is preferably thin enough to secure a light-transmitting property; and in the case of using a light-transmissive conductive film as the second electrode 543, a conductive film having a light-reflecting property is preferably stacked therewith.

A conductive composition containing a conductive high molecule (also referred to as a conductive polymer) can be used for the first electrodes 4030 and 541 and the second electrodes 4031 and 543. As the conductive high molecule, a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken owing to static electricity or the like, a protection circuit for protecting the driver circuit is preferably provided. The protection circuit is preferably formed using a nonlinear element.

By using the transistor described in Embodiment 1 as described above, the semiconductor device can have a variety of functions.

The structures, methods, and the like described in this embodiment can be combined as appropriate with any of the structures, methods, and the like described in the other embodiments.

(Embodiment 3)

A semiconductor device having an image sensor function of reading information on an object can be manufactured using the transistor described in Embodiment 1.

Figure 8A:
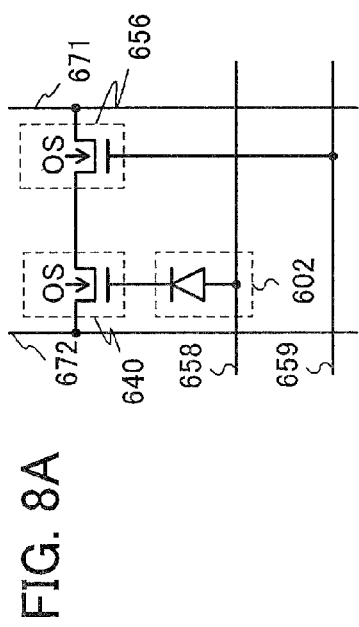
FIGS. 8A and 8B are a circuit diagram and a cross-sectional view illustrating one embodiment of a semiconductor device.

FIG. 8A illustrates an example of a semiconductor device having an image sensor function. FIG. 8A is an equivalent circuit diagram of a photosensor, and FIG. 8B is a cross-sectional view of part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain of the transistor 656 is electrically connected to a photosensor output signal line 671.

Note that in a circuit diagram in this specification, a transistor including an oxide semiconductor film is denoted by a symbol "OS" so that it can be identified as a transistor including an oxide semiconductor film. In FIG. 8A, the transistor 640 and the transistor 656 are each a transistor including an oxide semiconductor film, to which the transistor described in Embodiment 1 can be applied. Described in this embodiment is an example in which a transistor having a structure similar to that of the transistor 110 described in Embodiment 1 is used.

Figure 8B:
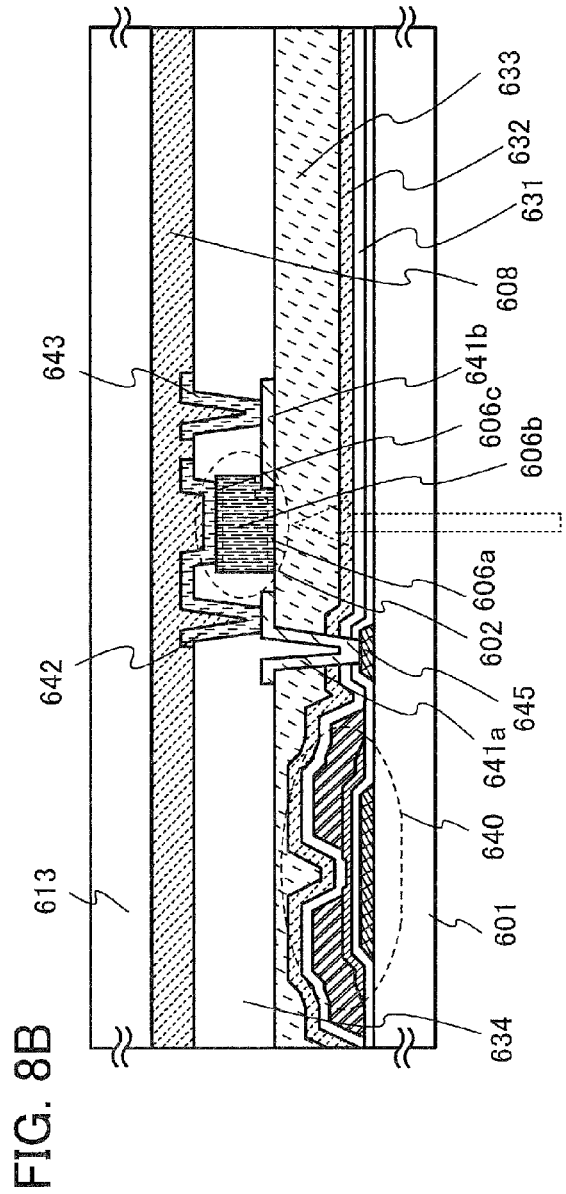

FIG. 8B is a cross-sectional view of the photodiode 602 and the transistor 640 in the photosensor. The photodiode 602 functioning as a sensor and the transistor 640 are provided over a substrate 601 (TFT substrate) having an insulating surface. A substrate 613 is provided over the photodiode 602 and the transistor 640 with the use of an adhesive layer 608.

A first protective insulating film 631, a second protective insulating film 632, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are stacked in this order from the interlayer insulating film 633 side, between electrodes 641a and 641b formed over the interlayer insulating film 633 and an electrode 642 formed over the interlayer insulating film 634.

The electrode 641b is electrically connected to a conductive layer 643 formed over the interlayer insulating film 634, and the electrode 642 is electrically connected to a conductive layer 645 through the electrode 641a. The conductive layer 645 is electrically connected to the gate electrode of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like to diffuse the impurity element. In this case, as a method for forming the amorphous silicon film, an LPCVD method, a vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like to diffuse the impurity element. In this case, as a method for forming the amorphous silicon film, an LPCVD method, a vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

The mobility of holes generated by the photoelectric effect is lower than the mobility of electrons. Thus, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having a conductivity type opposite to that of the semiconductor film on the light-receiving plane is disturbance light; thus, the electrode is preferably formed using a light-blocking conductive film. Note that a surface on the n-type semiconductor film side can alternatively be used as the light-receiving plane.

The first protective insulating film 631, the second protective insulating film 632, the interlayer insulating film 633, and the interlayer insulating film 634 can be formed using an insulating material by a sputtering method, a plasma CVD method, an SOG method, spin coating, dipping, spray coating, a droplet discharge method (such as an inkjet method), a printing method (such as screen printing or offset printing), or the like depending on the material.

The first protective insulating film 631 and the second protective insulating film 632 can be formed using an inorganic insulating material and can have a single-layer structure or a stacked-layer structure including any of oxide insulating films such as a silicon oxide layer, a silicon oxynitride layer, an aluminum oxide layer, and an aluminum oxynitride layer, and nitride insulating films such as a silicon nitride layer, a silicon nitride oxide layer, an aluminum nitride layer, and an aluminum nitride oxide layer, for example.

In this embodiment, a silicon oxynitride film formed by a plasma CVD method is used as the first protective insulating film 631, and an aluminum oxide film formed by a sputtering method is used as the second protective insulating film 632.

The aluminum oxide film provided as the second protective insulating film 632 over the oxide semiconductor film has a high shielding effect (blocking effect) of preventing penetration of both oxygen and impurities such as hydrogen and moisture.

Thus, in and after the manufacturing process, the aluminum oxide film functions as a protective film for preventing entry of impurities such as hydrogen and moisture, which can cause a variation in electrical characteristics of the transistor, into the oxide semiconductor film and release of oxygen, which is a main component material of the oxide semiconductor, from the oxide semiconductor film.

To reduce surface roughness, an insulating film functioning as a planarization insulating film is preferably used as each of the interlayer insulating films 633 and 634. For the interlayer insulating films 633 and 634, for example, an organic insulating material having heat resistance, such as a polyimide resin, an acrylic resin, a benzocyclobutene-based resin, a polyamide resin, or an epoxy resin, can be used. Other than such organic insulating materials, it is possible to use a single layer or stacked layers of a low-dielectric constant material (a low-k material), a siloxane-based resin, phosphosilicate glass (PSG), borophosphosilicate glass (BPSG), or the like.

With detection of light that enters the photodiode 602, information on an object to be detected can be read. Note that a light source such as a backlight can be used at the time of reading information on an object to be detected.

In the transistor 640 which can be formed with a structure and a formation method similar to those of the transistor 110 described in Embodiment 1, the threshold voltage is prevented from being a negative value.

Accordingly, the semiconductor devices of this embodiment illustrated in FIGS. 8A and 8B can be provided as a high-quality semiconductor device including the normally-off transistor 640 each of which includes an oxide semiconductor film. Further, such a highly reliable semiconductor device can be manufactured with a high yield, so that high productivity can be achieved.

The structures, methods, and the like described in this embodiment can be combined as appropriate with any of the structures, methods, and the like described in the other embodiments.

(Embodiment 4)

A semiconductor device disclosed in this specification can be applied to a variety of electronic devices (including game machines). Examples of electronic devices include a television set (also referred to as a television or a television receiver), a monitor of a computer or the like, cameras such as a digital camera and a digital video camera, a digital photo frame, a mobile phone, a portable game machine, a portable information terminal, an audio reproducing device, a game machine (e.g., a pachinko machine or a slot machine), a game console, and the like. Specific examples of these electronic devices are illustrated in FIGS. 9A to 9C.

Figure 9A:
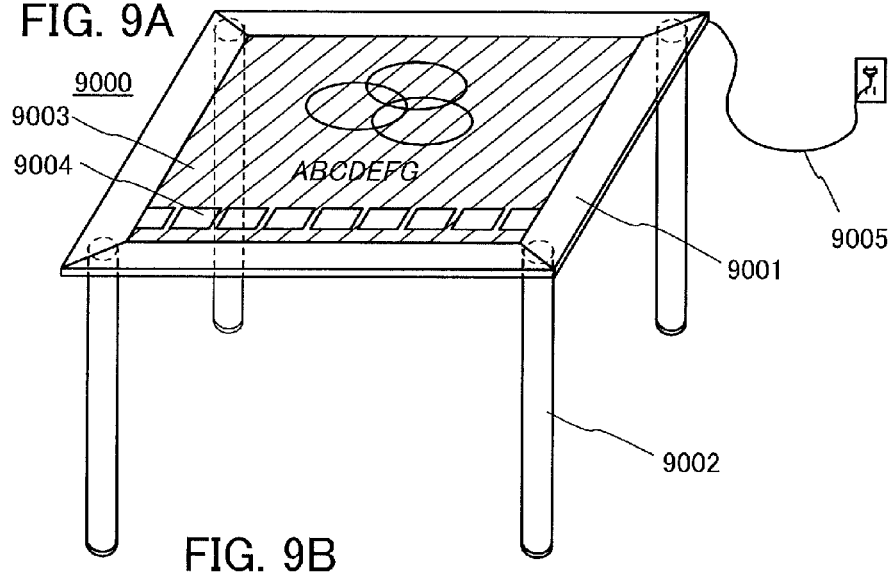
FIGS. 9A to 9C each illustrate an electronic device.
Figure 9B:
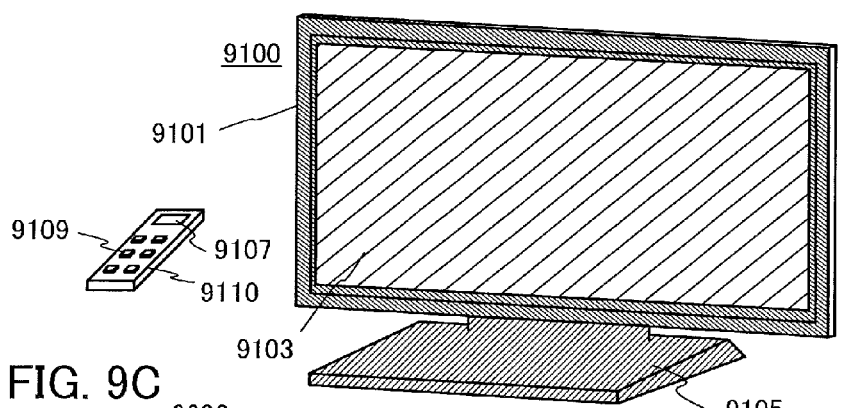
Figure 9C:
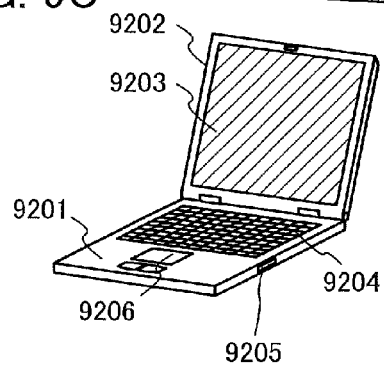

FIG. 9A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of Embodiments 1 to 3 can be used for the display portion 9003 so that the electronic device can have a high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table may be made to communicate with home appliances, the display portion 9003 may function as a control device which controls the home appliances by operation on the screen. For example, with the use of the semiconductor device having an image sensor function described in Embodiment 3, the display portion 9003 can have a touch-input function.

Further, the screen of the display portion 9003 can be placed perpendicular to a floor with a hinge provided for the housing 9001; thus, the table 9000 can also be used as a television set. When a television set having a large screen is set in a small room, an open space is reduced; however, when a display portion is incorporated in a table, a space in the room can be efficiently used.

FIG. 9B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 9B is provided with a receiver, a modem, and the like. With the receiver, the television set 9100 can receive general TV broadcasts. Further, the television set 9100 can be connected to a communication network by wired or wireless connection via the modem, which enables one-way (from sender to receiver) or two-way (between sender and receiver or between receivers) data communication.

The semiconductor device described in any of Embodiments 1 to 3 can be used for the display portions 9103 and 9107, whereby the television set and the remote controller can be provided with high reliability.

FIG. 9C illustrates a computer which includes a main body 9201, a housing 9202, a display portion 9203, a keyboard 9204, an external connection port 9205, a pointing device 9206, and the like.

The semiconductor device described in any of Embodiments 1 to 3 can be used for the display portion 9203, whereby the computer can be provided with high reliability.

Figure 10A:
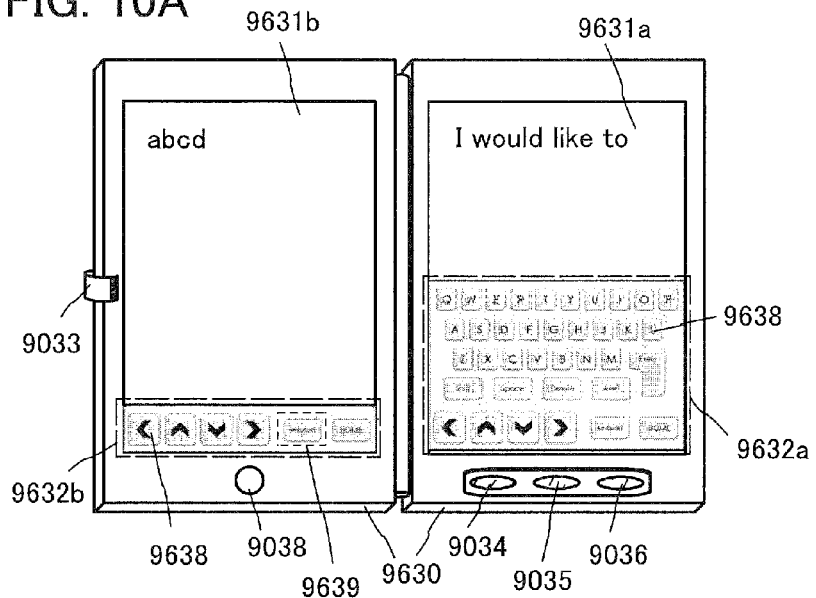
FIGS. 10A to 10C illustrate an electronic device.
Figure 10B:
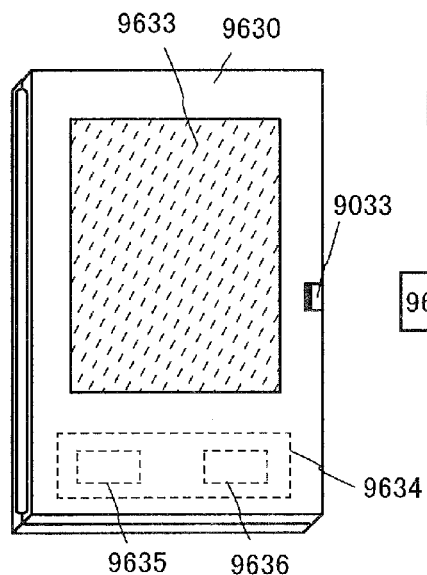

FIGS. 10A and 10B illustrate a tablet terminal that can be folded. In FIG. 10A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038.

The semiconductor device described in any of Embodiments 1 to 3 can be used for the display portion 9631a and the display portion 9631b, whereby the tablet terminal can be provided with high reliability.

A touch panel region 9632a can be provided in a part of the display portion 9631a, in which data can be input by touching displayed operation keys 9638. Although a structure in which a half region in the display portion 9631a has only a display function and the other half region also has a touch panel function is shown as an example, the display portion 9631a is not limited to the structure. The whole display portion 9631a may have a touch panel function. For example, the display portion 9631a can display a keyboard in the whole region to be used as a touch panel, and the display portion 9631b can be used as a display screen.

A touch panel region 9632b can be provided in part of the display portion 9631b like in the display portion 9631a. When a keyboard display switching button 9639 displayed on the touch panel is touched with a finger, a stylus, or the like, a keyboard can be displayed on the display portion 9631b.

Touch input can be performed concurrently on the touch panel region 9632a and the touch panel region 9632b.

The display-mode switching button 9034 allows switching between a landscape mode and a portrait mode, color display and black-and-white display, and the like. With the power-saving-mode switching button 9036, the luminance of display can be optimized in accordance with the amount of external light at the time when the tablet is in use, which is detected with an optical sensor incorporated in the tablet. The tablet terminal may include another detection device such as a sensor for detecting inclination (e.g., a gyroscope or an acceleration sensor) in addition to the optical sensor.

Although the display portion 9631a and the display portion 9631b have the same display area in FIG. 10A, one embodiment of the present invention is not limited to this structure. The display portion 9631a and the display portion 9631b may have different areas or different display quality. For example, one of them may be a display panel that can display higher-definition images than the other.

In FIG. 10B, the tablet terminal is folded, and includes the housing 9630, a solar battery 9633, a charge and discharge control circuit 9634, a battery 9635, and a DCDC converter 9636. FIG. 10B illustrates an example in which the charge and discharge control circuit 9634 includes the battery 9635 and the DCDC converter 9636.

Since the tablet terminal can be folded, the housing 9630 can be closed when not in use. Thus, the display portion 9631a and the display portion 9631b can be protected, which makes it possible to provide a tablet terminal with excellent durability and excellent reliability for long-term use.

The tablet terminal illustrated in FIGS. 10A and 10B can also have a function of displaying a variety of kinds of data (e.g., a still image, a moving image, and a text image), a function of displaying a calendar, a date, the time, or the like on the display portion, a touch input function of operating or editing data displayed on the display portion by touch input, a function of controlling processing by a variety of kinds of software (programs), and the like.

The solar battery 9633, which is attached on the surface of the tablet terminal, supplies electric power to a touch panel, a display portion, an image signal processor, and the like. Note that the solar battery 9633 can be provided on one or both surfaces of the housing 9630, so that the battery 9635 can be charged efficiently. The use of a lithium ion battery as the battery 9635 is advantageous in downsizing or the like.

Figure 10C:
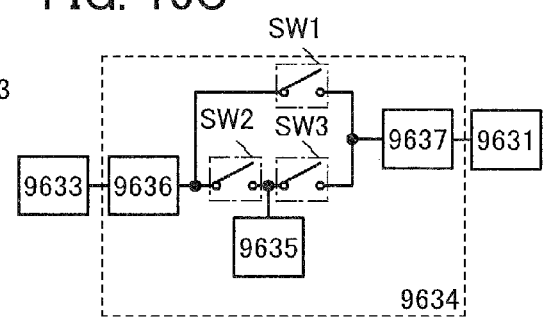

The structure and operation of the charge and discharge control circuit 9634 illustrated in FIG. 10B are described with reference to a block diagram of FIG. 10C. FIG. 10C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 in FIG. 10B.

First, an example of operation in the case where power is generated by the solar battery 9633 using external light is described. The voltage of power generated by the solar battery 9633 is raised or lowered by the DCDC converter 9636 to a voltage needed for charging the battery 9635. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is described as an example of a power generation means; however, there is no particular limitation on a way of charging the battery 9635, and the battery 9635 may be charged with any other power generation means such as a piezoelectric element or a thermoelectric conversion element (Peltier element). For example, the battery 9635 may be charged with a non-contact power transmission module capable of performing charging by transmitting and receiving electric power wirelessly (without contact), or any of the other charge means used in combination.

The structures, methods, and the like described in this embodiment can be combined as appropriate with any of the structures, methods, and the like described in the other embodiments.

This application is based on Japanese Patent Application serial no. 2012-103551 filed with Japan Patent Office on Apr. 27, 2012, and Japanese Patent Application serial no. 2013-052035 filed with Japan Patent Office on Mar. 14, 2013, the entire contents of which are hereby incorporated by reference.

What is claimed is:

1. A semiconductor device comprising:
a gate electrode over a substrate having an insulating surface;
a first insulating film over the gate electrode;
a first oxide semiconductor film over the first insulating film, the first oxide semiconductor film overlapping with at least a part of the gate electrode;
a source electrode and a drain electrode over the first oxide semiconductor film; and
a second insulating film over the first oxide semiconductor film, the source electrode, and the drain electrode,
wherein the first oxide semiconductor film comprises a pair of first regions, a second region, and a pair of third regions,
wherein the first oxide semiconductor film has a substantially uniform composition throughout,
wherein each of the pair of third regions comprises a top portion including a top surface and including no side surface and a side portion including a side surface and including no top surface,
wherein a top surface of the first oxide semiconductor film in one of the pair of first regions is in contact with one of the source electrode and the drain electrode,
wherein a top surface of the first oxide semiconductor film in the second region is in contact with the second insulating film,
wherein a thickness of the first oxide semiconductor film in the second region is smaller than a maximum thickness of the first oxide semiconductor film in the pair of first regions,
wherein the top surface and the side surface of the first oxide semiconductor film in one of the pair of third regions are in contact with the second insulating film, and
wherein the second region and the pair of third regions comprise a channel formation region.

2. The semiconductor device according to claim 1,
wherein the first oxide semiconductor film comprises a depression portion in the second region and a part of the pair of third regions, and
wherein the side surface of the first oxide semiconductor film in the pair of third regions includes an inner wall of the depression portion.

3. The semiconductor device according to claim 1, wherein a distance between one of the pair of first regions and the second region is equal to 0.059 to 0.5 of a distance between the source electrode and the drain electrode.

4. The semiconductor device according to claim 1, wherein the first oxide semiconductor film comprises a first tapered portion in the pair of third regions.

5. The semiconductor device according to claim 4,
wherein the first oxide semiconductor film comprises a second tapered portion in the pair of first regions, and
wherein an angle of the first tapered portion is larger than an angle of the second tapered portion.

6. The semiconductor device according to claim 1, wherein an edge portion of the gate electrode is outside an edge portion of the first oxide semiconductor film in a channel length direction.

7. The semiconductor device according to claim 1, wherein the second insulating film includes at least oxygen.

8. The semiconductor device according to claim 1, wherein the second region is located between the pair of third regions.

9. The semiconductor device according to claim 1, wherein the thickness of the first oxide semiconductor film in the second region is smaller than a maximum thickness of the first oxide semiconductor film in the pair of third regions.

10. The semiconductor device according to claim 1, further comprising a capacitor,
wherein the capacitor comprises:
a first electrode;
a second oxide semiconductor film over the first electrode with the first insulating film interposed therebetween; and
a second electrode over the second oxide semiconductor film,
wherein an edge portion of the second electrode is inside an edge portion of the second oxide semiconductor film, and
wherein the first oxide semiconductor film and the second oxide semiconductor film comprises a same material.

11. The semiconductor device according to claim 1,
wherein the first oxide semiconductor film is an IGZO film, and
wherein the second region comprises a c-axis aligned crystalline oxide semiconductor.

12. The semiconductor device according to claim 1,
wherein an angle made by the top surface and the side surface of the first oxide semiconductor film in the one of the pair of third regions is greater than or equal to 30° and less than or equal to 60°.

13. A semiconductor device comprising:
a gate electrode over a substrate having an insulating surface;
a gate insulating film over the gate electrode;
an oxide semiconductor film over the gate insulating film, the oxide semiconductor film overlapping with at least a part of the gate electrode;
a source electrode and a drain electrode over the oxide semiconductor film; and
an insulating film over the oxide semiconductor film, the source electrode, and the drain electrode,
wherein the oxide semiconductor film comprises a pair of first regions, a second region, and a pair of third regions,
wherein the oxide semiconductor film has a substantially uniform composition throughout,
wherein each of the pair of third regions comprises a top portion including a top surface and including no side surface and a side portion including a side surface and including no top surface,
wherein a top surface of the oxide semiconductor film in one of the pair of first regions is in contact with one of the source electrode and the drain electrode,
wherein a top surface of the oxide semiconductor film in the second region is in contact with the insulating film,
wherein the top surface and the side surface of the oxide semiconductor film in one of the pair of third regions are in contact with the insulating film,
wherein a thickness of the oxide semiconductor film in the second region is substantially uniform, and smaller than each of a maximum thickness of the oxide semiconductor film in the pair of first regions and a maximum thickness of the oxide semiconductor film in the pair of third regions,
wherein the oxide semiconductor film comprises a curved surface in the pair of third regions, and
wherein the second region and the pair of third regions comprise a channel formation region.

14. The semiconductor device according to claim 13, wherein a distance between one of the pair of first regions and the second region is equal to 0.059 to 0.5 of a distance between the source electrode and the drain electrode.

15. The semiconductor device according to claim 13, wherein the insulating film includes at least oxygen.

16. The semiconductor device according to claim 13, wherein one of the pair of third regions is located between the second region and one of the pair of first regions.

17. The semiconductor device according to claim 13, wherein a curvature center of the curved surface is positioned on a substrate side.

18. The semiconductor device according to claim 13, wherein a curvature center of the curved surface is positioned on an insulating film side.

19. The semiconductor device according to claim 13,
wherein the oxide semiconductor film is an IGZO film, and
wherein the second region comprises a c-axis aligned crystalline oxide semiconductor.

20. The semiconductor device according to claim 13, wherein an angle made by the top surface and the side surface of the oxide semiconductor film in the one of the pair of third regions is greater than or equal to 30° and less than or equal to 60°.

* * * * *